(12) United States Patent
Tsunoda et al.

(10) Patent No.: US 10,354,940 B2
(45) Date of Patent: Jul. 16, 2019

(54) SEMICONDUCTOR DEVICE

(71) Applicant: Mitsubishi Electric Corporation, Tokyo (JP)

(72) Inventors: Tetsujiro Tsunoda, Tokyo (JP); Toru Ichimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 15/898,676

(22) Filed: Feb. 19, 2018

(65) Prior Publication Data
US 2019/0051581 A1 Feb. 14, 2019

(30) Foreign Application Priority Data
Aug. 9, 2017 (JP) ................................. 2017-154595

(51) Int. Cl.
*H01L 23/433* (2006.01)
*H01L 23/367* (2006.01)
*H01L 23/373* (2006.01)

(52) U.S. Cl.
CPC ...... *H01L 23/4334* (2013.01); *H01L 23/3677* (2013.01); *H01L 23/3735* (2013.01)

(58) Field of Classification Search
CPC ............. H01L 23/4334; H01L 23/3735; H01L 23/3677
See application file for complete search history.

(56) References Cited

U.S. PATENT DOCUMENTS 4,101,970 A * 7/1978 Saito .................... G11C 19/085
365/2

FOREIGN PATENT DOCUMENTS

JP 2005-303018 A 10/2005

* cited by examiner

*Primary Examiner* — Hoa B Trinh
(74) *Attorney, Agent, or Firm* — Studebaker & Brackett PC

(57) ABSTRACT

According to the present invention, a semiconductor device includes a first metal plate, a second metal plate provided above the first metal plate, a third metal plate provided above the second metal plate, a first semiconductor chip provided between the first metal plate and the second metal plate, a second semiconductor chip provided between the second metal plate and the third metal plate and a cooling member, wherein the first metal plate has a first cooling portion that is in contact with the cooling member, the second metal plate has a second cooling portion that is in contact with the cooling member, and the third metal plate has a third cooling portion that is in contact with the cooling member.

16 Claims, 27 Drawing Sheets

SEMICONDUCTOR DEVICE

BACKGROUND OF THE INVENTION

Field

The present invention relates to a semiconductor device.

Background

JP 2005-303018 A discloses a package having a structure in which plural power semiconductor devices are provided between three laminated substrates, respectively. In this package, heat radiation fins are fitted to upper and lower sides of the package.

In JP 2005-303018 A, the heat radiation fins which are large-size cooling members are fitted to the upper and lower sides of a power module to cool the power module. Therefore, it is necessary to secure spaces in which the cooling members are arranged at the upper and lower sides of the power module. Furthermore, there is a problem that the thickness of the power module is large and the space size for arranging the power module increases. Still furthermore, the cooling members are not connected to the center substrate out of the three substrates in JP 2005-303018 A. Accordingly, cooling from the center substrate may be insufficient.

SUMMARY

The present invention has been implemented to solve the above problem, and has an object to provide a semiconductor device capable of efficiently performing cooling.

The features and advantages of the present invention may be summarized as follows.

According to the present invention, a semiconductor device includes a first metal plate having a first mounting surface, a second metal plate having a second mounting surface facing the first mounting surface, and a third mounting surface which is a surface on an opposite side to the second mounting surface, the second metal plate being provided above the first metal plate, a third metal plate that has a fourth mounting surface facing the third mounting surface, and is provided above the second metal plate, a first semiconductor chip that is provided between the first metal plate and the second metal plate, and has a back-side electrode joined to the first mounting surface and an upper-side electrode joined to the second mounting surface, a second semiconductor chip that is provided between the second metal plate and the third metal plate, and has a back-side electrode joined to the third mounting surface and an upper-side electrode joined to the fourth mounting surface and a cooling member, wherein the first metal plate has a first cooling portion that extends from a portion to which the first semiconductor chip is joined, and is in contact with the cooling member, the second metal plate has a second cooling portion that extends from a portion to which the first semiconductor chip and the second semiconductor chip are joined, and is in contact with the cooling member, and the third metal plate has a third cooling portion that extends from a portion to which the second semiconductor chip is joined, and is in contact with the cooling member.

Other and further objects, features and advantages of the invention will appear more fully from the following description.

DESCRIPTION OF EMBODIMENTS

Figure 1:
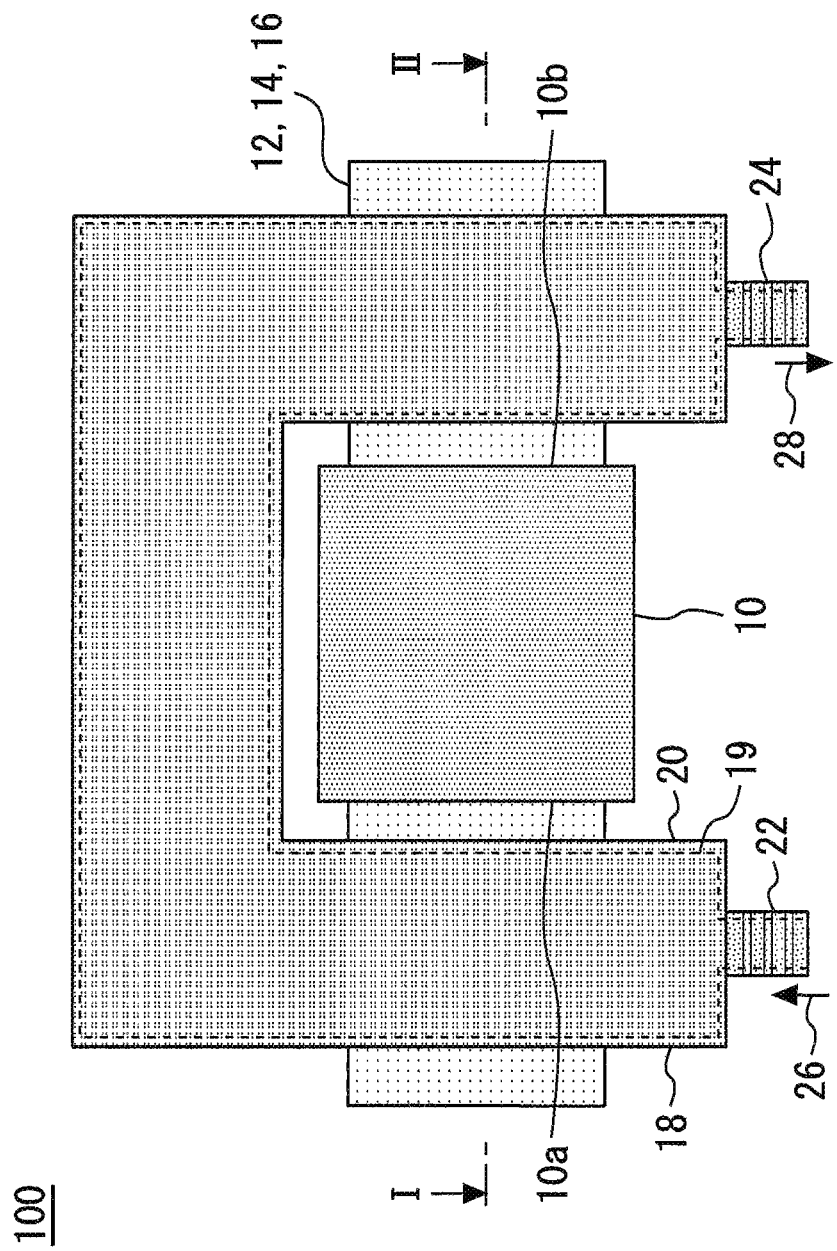
FIG. 1 is a plan view showing a semiconductor device according to a first embodiment.

A semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a plan view showing a semiconductor device 100 according to a first embodiment. The semiconductor device 100 has a sealing member 10. A first metal plate 12, a second metal plate 14 and a third metal plate 16 protrude from side surfaces of the sealing member 10. The first metal plate 12, the second metal plate 14 and the third metal plate 16 protrude from both sides of the sealing member 10. The first metal plate 12, the second metal plate 14 and the third metal plate 16 are laminated in this order.

The semiconductor device 100 has a cooling member 18. The cooling member 18 has a cooling flow channel 19 which is a flow passage for cooling liquid. The cooling member 18 has an insulator 20 surrounding the cooling flow channel 19. In this embodiment, the semiconductor device 100 has a plurality of cooling members 18. The plural cooling members 18 are provided so as to overlap one another in plan view. Each of the plural cooling members 18 is provided beneath the first metal plate 12, between the first metal plate 12 and the second metal plate 14, between the second metal plate 14 and the third metal plate 16 and on the third metal plate 16. In this case, the structure of the cooling member 18 provided on the third metal plate 16 will be described.

An inflow port 22 for cooling liquid is provided at one end of the cooling member 18. The cooling member 18 extends from the inflow port 22. The cooling member 18 traverses a portion of the third metal plate 16 in a short-side direction of the third metal plate 16, the portion protruding from a first side surface 10a of the sealing member 10. Thereafter, the cooling member 18 crooks and extends along a longitudinal direction of the third metal plate 16. The cooling member 18 extends from the first side surface 10a to a second side surface 10b which is a side surface on an opposite side to the first side surface 10a with respect to the sealing member 10. Thereafter, the cooling member 18 traverses a portion of the third metal plate 16 in the short-side direction of the third metal plate 16, the portion protruding from the second side surface 10b. An outflow port 24 for cooling liquid is provided to the other end of the cooling member 18.

The cooling liquid flows from the inflow port 22 to the cooling flow channel 19 in a direction indicated by an arrow 26. The cooling liquid flows in the cooling flow channel 19, and flows out from the outflow port 24 in a direction indicated by an arrow 28. The cooling members 18 provided beneath the first metal plate 12, between the first metal plate 12 and the second metal plate 14 and between the second metal plate 14 and the third metal plate 16 out of the plurality of cooling members 18 have the same structure. The first metal plate 12, the second metal plate 14 and the third metal plate 16 are cooled by the plurality of cooling members 18. The cooling liquid is water, for example.

Figure 2:
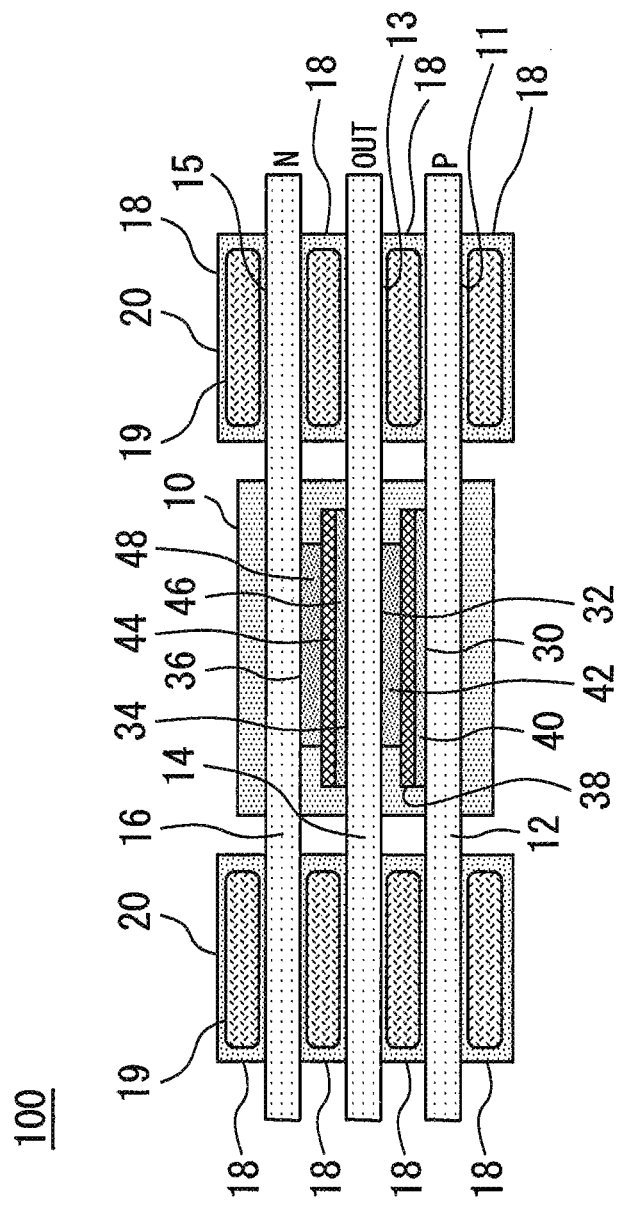
FIG. 2 is a cross-sectional view showing the semiconductor device according to the first embodiment.

FIG. 2 is a cross-sectional view showing the semiconductor device 100 according to the first embodiment. FIG. 2 is a cross-sectional view obtained by cutting FIG. 1 along a I-II line of FIG. 1. The first metal plate 12 has a first mounting surface 30. The second metal plate 14 is provided above the first metal plate 12. The second metal plate 14 has a second mounting surface 32 facing the first mounting surface 30, and a third mounting surface 34 which is a surface on the opposite side to the second mounting surface 32. The third metal plate 16 is provided above the second metal plate 14. The third metal plate 16 has a fourth mounting surface 36 facing the third mounting surface 34.

The first metal plate 12, the second metal plate 14 and the third metal plate 16 are configured to have a flat-plate shape. The first metal plate 12, the second metal plate 14 and the third metal plate 16 are arranged in parallel to one another.

The semiconductor device 100 has a first semiconductor chip 38 and a second semiconductor chip 44. The first semiconductor chip 38 and the second semiconductor chip 44 are power semiconductor devices. Each of the first semiconductor chip 38 and the second semiconductor chip 44 is RC-IGBT (Reverse Conducting Insulated Gate Bipolar Transistor), for example. However, this embodiment is not limited to this configuration, and an IGBT chip and a diode chip may be separately provided in each of the first semiconductor chip 38 and the second semiconductor chip 44.

The first semiconductor chip 38 is provided between the first metal plate 12 and the second metal plate 14. The first semiconductor chip 38 is joined to the first mounting surface 30 via a back-side electrode of the first semiconductor chip 38, and joined to the second mounting surface 32 via an upper-side electrode of the first semiconductor chip 38. The first semiconductor chip 38 is joined to the first mounting surface 30 by solder 40. The first semiconductor chip 38 is joined to the second mounting surface 32 by solder 42.

The second semiconductor chip 44 is provided between the second metal plate 14 and the third metal plate 16. The second semiconductor chip 44 is joined to the third mounting surface 34 via a back-side electrode of the second semiconductor chip 44, and joined to the fourth mounting surface 36 via an upper-side electrode of the second semiconductor chip 44. The second semiconductor chip 44 is joined to the third mounting surface 34 by solder 46. The second semiconductor chip 44 is joined to the fourth mounting surface 36 by solder 48.

In each of the first semiconductor chip 38 and the second semiconductor chip 44, the upper-side electrode contains an emitter electrode and a gate electrode of IGBT and an anode electrode of a diode. The back-side electrode contains a collector electrode of IGBT and a cathode electrode of a diode.

A wiring pattern to be connected to the back-side electrode of the first semiconductor chip 38 is provided on the first mounting surface 30. A wiring pattern to be connected to the upper-side electrode of the first semiconductor chip 38 is provided on the second mounting surface 32. A wiring pattern to be connected to the back-side electrode of the second semiconductor chip 44 is provided on the third mounting surface 34. A wiring pattern to be connected to the upper-side electrode of the second semiconductor chip 44 is provided on the fourth mounting surface 36.

When viewed from the direction perpendicular to the first mounting surface 30, the second semiconductor chip 44 overlaps the first semiconductor chip 38. However, this embodiment is not limited to this configuration, and the first and second semiconductor chips 38 and 44 may be positionally displaced from each other in the direction along the first mounting surface 30. The sealing member 10 seals the first semiconductor chip 38 and the second semiconductor chip 44.

Each of the first metal plate 12, the second metal plate 14 and the third metal plate 16 is in contact with the plural cooling members 18, whereby a cooling portion is formed in each of the first metal plate 12, the second metal plate 14 and the third metal plate 16.

The first metal plate 12 has a first cooling portion 11 extending from a portion to which the first semiconductor chip 38 is joined. The first cooling portion 11 is in contact with plural cooling members 18. The second metal plate 14 has a second cooling portion 13 extending from a portion to which the first semiconductor chip 38 and the second semiconductor chip 44 are joined. The second cooling portion 13 is in contact with plural cooling members 18. The third metal plate 16 has a third cooling portion 15 extending from a portion to which the second semiconductor chip 44 is joined. The third cooling portion 15 is in contact with plural cooling members 18.

The first cooling portion 11, the second cooling portion 13 and the third cooling portion 15 are provided so as to overlap one another when viewed from the direction perpendicular to the first mounting surface 30. The plural cooling members 18 are provided between the first cooling portion 11 and the second cooling portion 13 and between the second cooling portion 13 and the third cooling portion 15 respectively. Furthermore, the plural cooling members 18 are provided to a surface of the first cooling portion 11 on the opposite side to the second cooling portion 13 and to a surface of the third cooling portion 15 on the opposite side to the second cooling portion 13 respectively. Each of the first cooling portion 11, the second cooling portion 13 and the third cooling portion 15 is sandwiched by two cooling members 18.

The first cooling portion 11, the second cooling portion 13 and the third cooling portion 15 protrude from the side surfaces of the sealing member 10. In the semiconductor device 100, the plural cooling members 18 are provided outside the sealing member 10. That is, the plural cooling members 18 are provided at the outside of an area where the first semiconductor chip 38 and the second semiconductor chip 44 are provided when viewed from the direction perpendicular to the first mounting surface 30.

Each of the first metal plate 12, the second metal plate 14 and the third metal plate 16 is in contact with the plural cooling members 18 on both sides of the sealing member 10. Therefore, the first metal plate 12 has plural first cooling portions 11 extending from both sides of the portion to which the first semiconductor chip 38 is joined. Likewise, the second metal plate 14 has plural second cooling portions 13 extending from both sides of the portion to which the first semiconductor chip 38 and the second semiconductor chip 44 are joined. The third metal plate 16 has plural third cooling portions 15 extending from both sides of the portion to which the second semiconductor chip 44 is joined.

Each of the first cooling portions 11, the second cooling portions 13 and the third cooling portions 15 is in contact with plural cooling members 18. In each cooling member 18, the insulator 20 surrounding the cooling flow channel 19 is formed of insulating resin having high thermal conductivity. The first metal plate 12, the second metal plate 14 and the third metal plate 16, and the plural cooling flow channels 19 are insulated from one another by the insulators 20. Heat of each of the first metal plate 12, the second metal plate 14 and the third metal plate 16 is conducted into the cooling liquid in the cooling flow channels 19 via the insulators 20. Circulation of the cooling liquid causes the first metal plate 12, the second metal plate 14 and the third metal plate 16 to radiate heat, whereby the first semiconductor chip 38 and the second semiconductor chip 44 are cooled.

Figure 3:
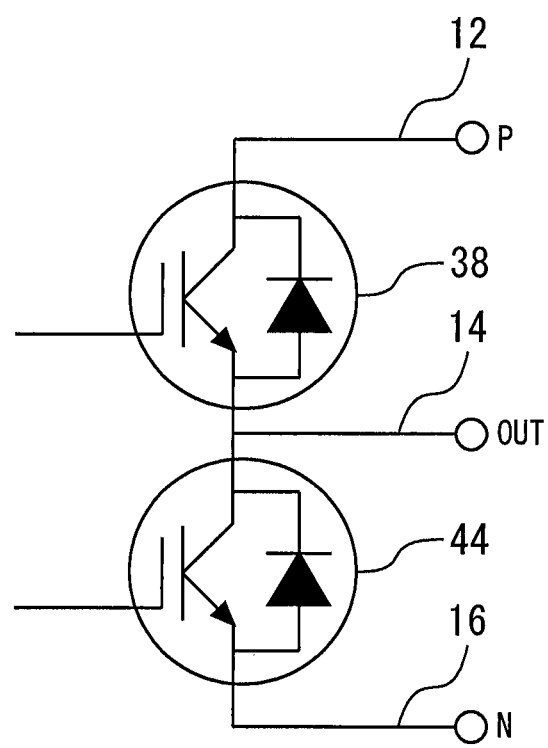
FIG. 3 is an equivalent circuit diagram of the semiconductor device according to the first embodiment.

FIG. 3 is an equivalent circuit diagram of the semiconductor device 100 according to the first embodiment. The first semiconductor chip 38 and the second semiconductor chip 44 are connected to each other in series. IGBT and a diode are formed in the first semiconductor chip 38. Likewise, IGBT and a diode are formed in the second semiconductor chip 44. The collector of IGBT and the cathode of the diode are connected to each other in each of the first semiconductor chip 38 and the second semiconductor chip 44. Furthermore, the emitter of IGBT and the anode of the diode are connected to each other.

The first semiconductor chip 38 constitutes a positive-electrode side arm. The positive-electrode side arm is an upper arm. The second semiconductor chip 44 constitutes a negative-electrode side arm. The negative-electrode side arm is a lower arm. The first metal plate 12 serves as a P electrode which is a DC input on the positive-electrode side. The second metal plate 14 serves as an output electrode which is an AC output. Furthermore, the third metal plate 16 serves as an N electrode which is a DC input on the negative-electrode side. From the foregoing, the semiconductor device 100 constitutes a power module of one phase.

In the semiconductor device 100 according to the embodiment, all of the first metal plate 12, the second metal plate 14 and the third metal plate 16 are in contact with the plural cooling members 18. Therefore, even when the semiconductor device 100 is a power module handling large power, the semiconductor device 100 can be efficiently cooled. Here, the first metal plate 12, the second metal plate 14 and the third metal plate 16 are directly connected to the plural cooling members 18. That is, each of the first metal plate 12, the second metal plate 14 and the third metal plate 16 is connected to the cooling members 18 via no other metal plate. Accordingly, each of the metal plates can be efficiently cooled.

Furthermore, the first metal plate 12, the second metal plate 14 and the third metal plate 16 are widely led out from the sealing member 10 in a direction along the first mounting surface 30, whereby the areas of the first cooling portion 11, the second cooling portion 13 and the third cooling portion 15 can be increased. Therefore, the contact area of the plural cooling members 18 and the first metal plate 12, the second metal plate 14 and the third metal plate 16 can be increased. Accordingly, the cooling efficiency can be further enhanced.

In this embodiment, it is unnecessary to arrange the cooling members 18 just above and just below the first semiconductor chip 38 and the second semiconductor chip 44. Therefore, the thickness of the semiconductor device 100 can be reduced, so that the semiconductor device 100 can be miniaturized. The structure of the semiconductor device 100 can be simplified because it is unnecessary to arrange the cooling members 18 just above or just below the first semiconductor chip 38 and the second semiconductor chip 44. Accordingly, the space in which the semiconductor device 100 is arranged can be reduced.

The semiconductor device 100 is a power module in which the first semiconductor chip 38 and the second semiconductor chip 44 constitute the upper and lower arms. However, the embodiment is not limited to this configuration, and may be applied to any semiconductor device in which a plurality of substrates are laminated and plural semiconductor chips are provided between the plural substrates, respectively. For example, the first semiconductor chip 38 and the second semiconductor chip 44 may be different types of semiconductor chips. Furthermore, the semiconductor device 100 may have four or more metal plates. Still furthermore, plural semiconductor chips may be provided between the first metal plate 12 and the second metal plate 14 or between the second metal plate 14 and the third metal plate 16.

In this embodiment, each of the cooling members 18 is connected so that the cooling liquid flows from the first side surface 10a side of the sealing member 10 to the second side surface 10b side along the sealing member 10. This embodiment is not limited to this configuration, and the plural cooling members 18 may be provided so as to be in contact with at least each of the first metal plate 12, the second metal plate 14 and the third metal plate 16. For example, in each cooling member 18, the cooling flow channel 19 provided on one side of the sealing member 10 and the cooling flow channel 19 provided on the other side of the sealing member 10 may be separated from each other.

In this embodiment, each of the first metal plate 12, the second metal plate 14 and the third metal plate 16 is in contact with plural cooling members 18 at both sides of the sealing member 10. This embodiment is not limited to this configuration, and each of the first metal plate 12, the second metal plate 14 and the third metal plate 16 may be in contact with plural cooling members 18 at one side of the sealing member 10.

The first semiconductor chip 38 and the second semiconductor chip 44 may be formed of a wide bandgap semiconductor. The wide bandgap semiconductor is silicon carbide, gallium-nitride-based material or diamond, for example. The first semiconductor chip 38 and the second semiconductor chip 44 are formed of the wide bandgap semiconductor, whereby voltage endurance and permissible current density of the first semiconductor chip 38 and the second semiconductor chip 44 can be enhanced. Therefore, the first semiconductor chip 38 and the second semiconductor chip 44 can be miniaturized. Accordingly, the semiconductor device 100 can be further miniaturized.

When IGBT and a diode are formed separately from each other in the first semiconductor chip 38 and the second semiconductor chip 44, one of IGBT and the diode may be formed of a wide bandgap semiconductor. In this case, the effect of miniaturizing the semiconductor device 100 can be also obtained.

Figure 4:
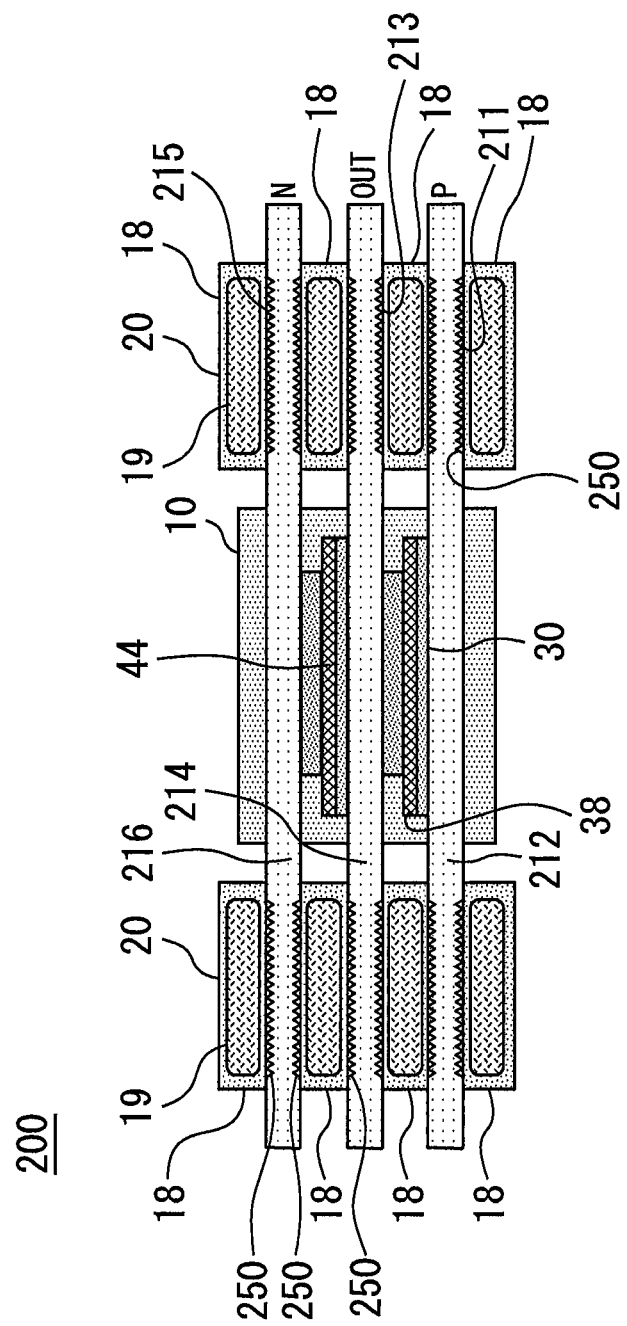
FIG. 4 is a cross-sectional view of a semiconductor device according to a first modification of the first embodiment.

FIG. 4 is a cross-sectional view of a semiconductor device 200 according to a first modification of the first embodiment. In the first modification, the structures of a first metal plate 212, a second metal plate 214 and a third metal plate 216 are different from those of the first embodiment. The first metal plate 212 has a first cooling portion 211. The first cooling portion 211 is in contact with plural cooling members 18. The second metal plate 214 has a second cooling portion 213. The second cooling portion 213 is in contact with plural cooling members 18. The third metal plate 216 has a third cooling portion 215. The third cooling portion 215 is in contact with plural cooling members 18.

Plural irregularities 250 are provided on each of surfaces of the first cooling portion 211, the second cooling portion 213 and the third cooling portion 215 which are in contact with the plural cooling members 18. Each irregularity 250 is filled with an insulator 20. Therefore, as compared with the first embodiment, the contact area of the first cooling portion 211, the second cooling portion 213 and the third cooling portion 215 and the plural cooling members 18 is larger. Accordingly, the semiconductor device 200 can be more efficiently cooled.

Figure 5:
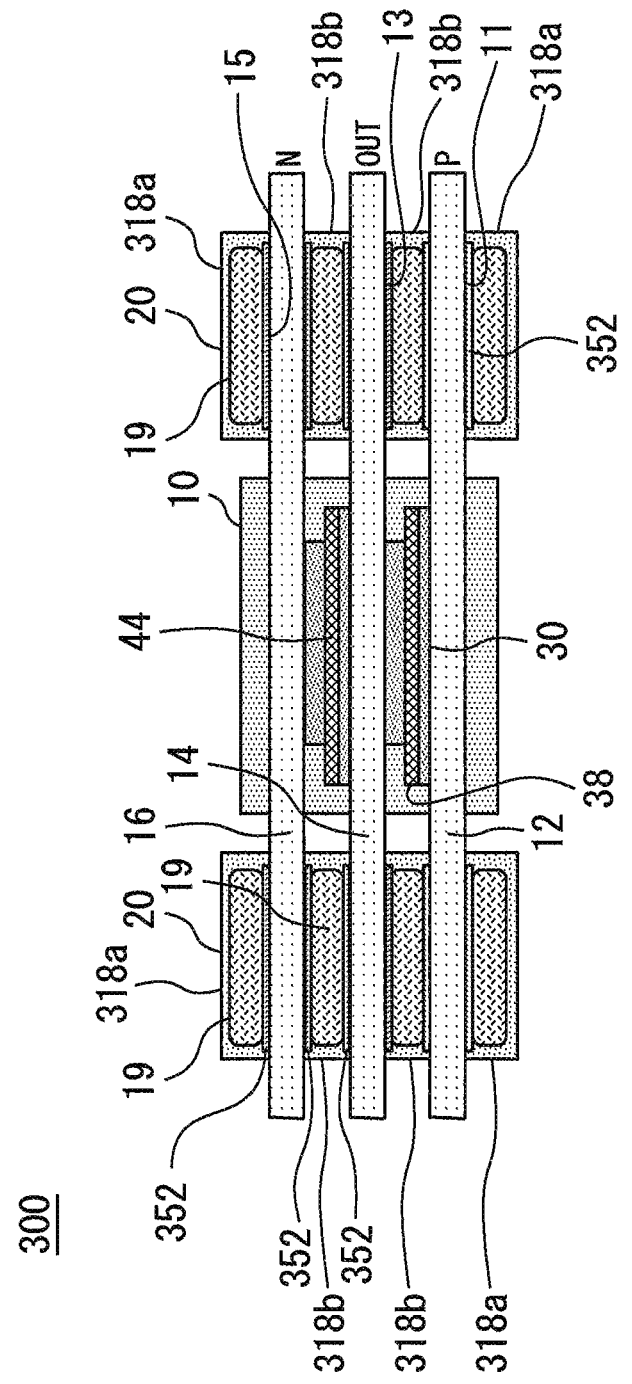
FIG. 5 is a cross-sectional view of a semiconductor device according to a second modification of the first embodiment.

FIG. 5 is a cross-sectional view of a semiconductor device 300 according to a second modification of the first embodiment. In the second embodiment, the structures of plural cooling members 318a, 318b are different from that of the first embodiment. The plural cooling members 318a, 318b have plural cooling flow channels 19, respectively. Plural high thermal-conductive insulators 352 are respectively provided between the first to third cooling portions 11, 13, 15 and the plural cooling flow channels 19. Each of the first cooling portion 11, the second cooling portion 13 and the third cooling portion 15 is connected to the plural cooling flow channels 19 via the plural high thermal-conductive insulators 352.

The high thermal-conductive insulator 352 has a higher thermal conductivity than the insulator 20. The high thermal-conductive insulator 352 is formed of aluminum nitride, silicon nitride or the like, for example.

The plural cooling members 318a are provided beneath the first cooling portion 11 and on the third cooling portion 15 respectively. Each cooling member 318a has a cooling flow channel 19, an insulator 20 and a high thermal-conductive insulator 352. The high thermal-conductive insulator 352 is provided between the cooling flow channel 19 and the first cooling portion 11 or the third cooling portion 15.

The plural cooling members 318b are provided between the first cooling portion 11 and the second cooling portion 13 and between the second cooling portion 13 and the third cooling portion 15 respectively. Each cooling member 318b has a cooling flow channel 19, an insulator 20 and two high thermal-conductive insulators 352. The two high thermal-conductive insulators 352 are provided at the upper and lower sides of the cooling flow channel 19.

In the second modification, as compared with the first embodiment, heat is more liable to be conducted from the first cooling portion 11, the second cooling portion 13 and the third cooling portion 15 to the plural cooling flow channels 19. Therefore, the semiconductor device 300 can be more efficiently cooled and a power module having excellent cooling performance can be obtained.

Figure 6:
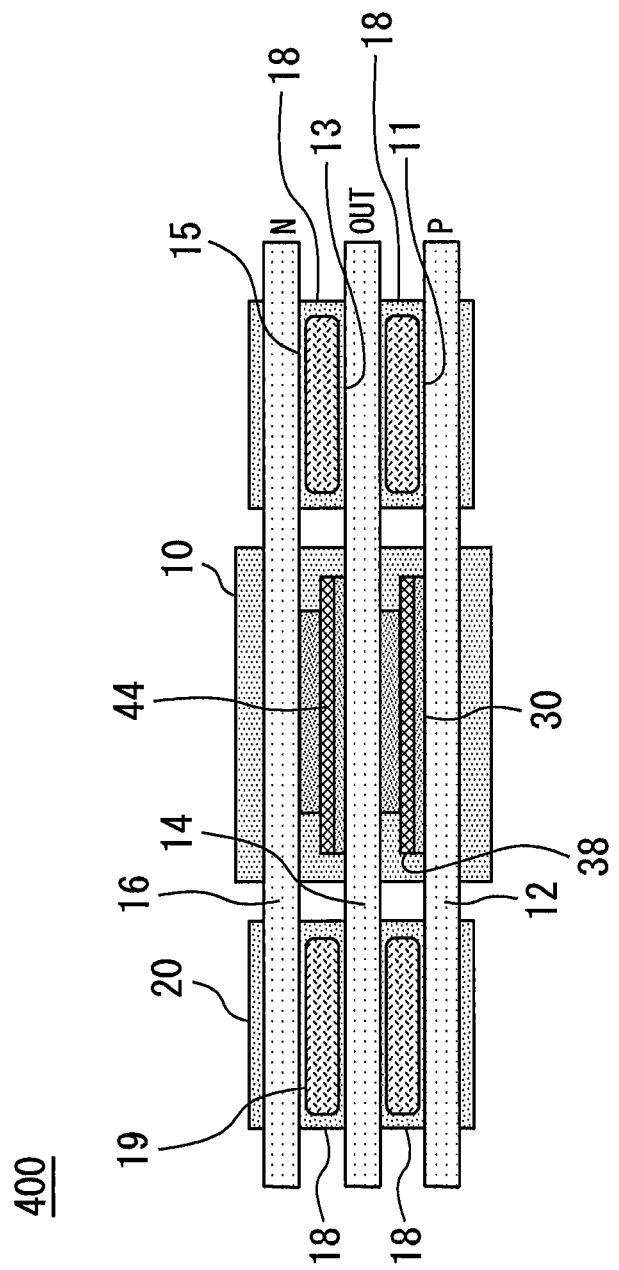
FIG. 6 is a cross-sectional view showing a semiconductor device according to a third modification of the first embodiment.

FIG. 6 is a cross-sectional view showing a semiconductor device 400 according to a third modification of the first embodiment. In the semiconductor device 400, the plural cooling members 18 are arranged only between the first cooling portion 11 and the second cooling portion 13 and between the second cooling portion 13 and the third cooling portion 15 respectively. In the third modification, as compared with the first embodiment, the semiconductor device 400 can be reduced in thickness. Accordingly, the semiconductor device 400 can be further miniaturized. Furthermore, as compared with the first embodiment, the number of the cooling members 18 is reduced, and thus the manufacturing cost of the semiconductor device 400 can be reduced.

Figure 7:
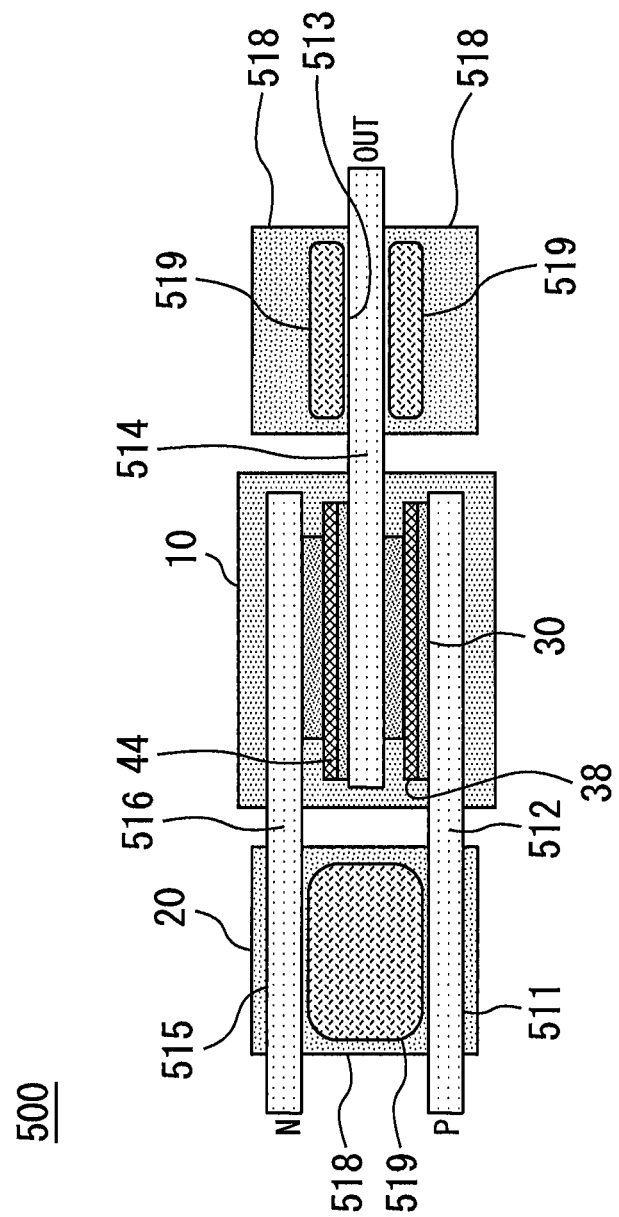
FIG. 7 is a cross-sectional view of a semiconductor device according to a fourth modification of the first embodiment.

FIG. 7 is a cross-sectional view of a semiconductor device 500 according to a fourth modification of the first embodiment. The semiconductor device 500 has a first metal plate 512, a second metal plate 514 and a third metal plate 516. The first metal plate 512 has a first cooling portion 511 protruding from one side surface of the sealing member 10. The second metal plate 514 has a second cooling portion 513 protruding from another surface of the sealing member 10. The third metal plate 516 has a third cooling portion 515 protruding in the same direction as the first cooling portion 511 from the sealing member 10.

The first cooling portion 511 and the third cooling portion 515 are provided so as to overlap each other when viewed in the direction perpendicular to the first mounting surface 30. The second cooling portion 513 extends from a portion to which the first semiconductor chip 38 and the second semiconductor chip 44 are joined, in a direction toward the opposite side to the first cooling portion 511 and the third cooling portion 515 when viewed from the direction perpendicular to the first mounting surface 30.

On the side where the second metal plate 514 protrudes from the sealing member 10, the plural cooling members 518 are provided at both sides of the second cooling portion 513 in the direction perpendicular to the first mounting surface 30. On the side where the first metal plate 512 protrudes from the sealing member 10, the plural cooling members 518 are provided between the first cooling portion 511 and the third cooling portion 515. The plural cooling flow channels 519 respectively equipped to the plural cooling members 518 join each other between the first cooling portion 511 and the third cooling portion 515. This embodiment is not limited to this configuration, and the plural cooling flow channels 519 may be separated from each other between the first cooling portion 511 and the third cooling portion 515.

In the fourth modification, the first metal plate 512 serving as the P electrode and the third metal plate 516 serving as the N electrode are led out from the sealing member 10 so as to extend in parallel to each other. Accordingly, the mutual inductance between the P electrode and the N electrode can be reduced, so that the serge voltage can be reduced. Furthermore, it is possible to perform high-frequency switching of the semiconductor device 500. In addition, since the second metal plate 514 serving as the output electrode protrude to the opposite side to the first metal plate 512 and the third metal plate 516, a load and the semiconductor device 500 can be easily connected to each other.

In the fourth modification, the second cooling portion 513 extends to the opposite side to the first cooling portion 511 and the third cooling portion 515. This embodiment is not limited to this configuration, and the second cooling portion 513 may extend from a portion to which the first semiconductor chip 38 and the second semiconductor chip 44 are joined, in a different direction from extension directions of the first cooling portion 511 and the third cooling portion 515 when viewed from the direction perpendicular to the first mounting surface 30.

Figure 8:
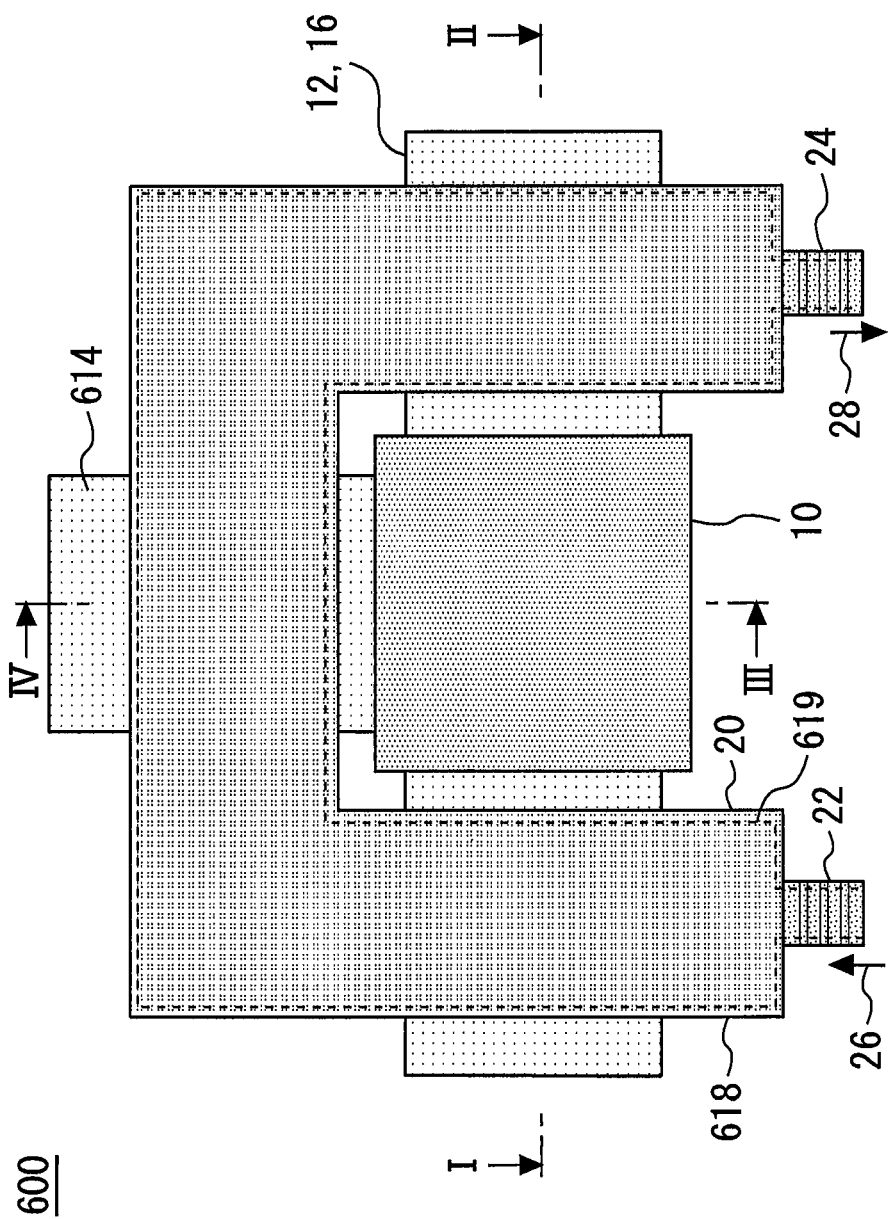
FIG. 8 is a plan view showing a semiconductor device according to a fifth modification of the first embodiment.

FIG. 8 is a plan view showing a semiconductor device 600 according to a fifth modification of the first embodiment. The semiconductor device 600 has a first metal plate 12, a second metal plate 614 and a third metal plate 16. The first metal plate 12 protrudes from both sides of the sealing member 10. The third metal plate 16 protrudes from both sides of the sealing member 10 in the same direction as the first metal plate 12. The second metal plate 614 protrudes from the sealing member 10 in the direction perpendicular to the first metal plate 12. The semiconductor device 600 has plural cooling members 618. The plural cooling members 618 have plural cooling flow channels 619.

Figure 9:
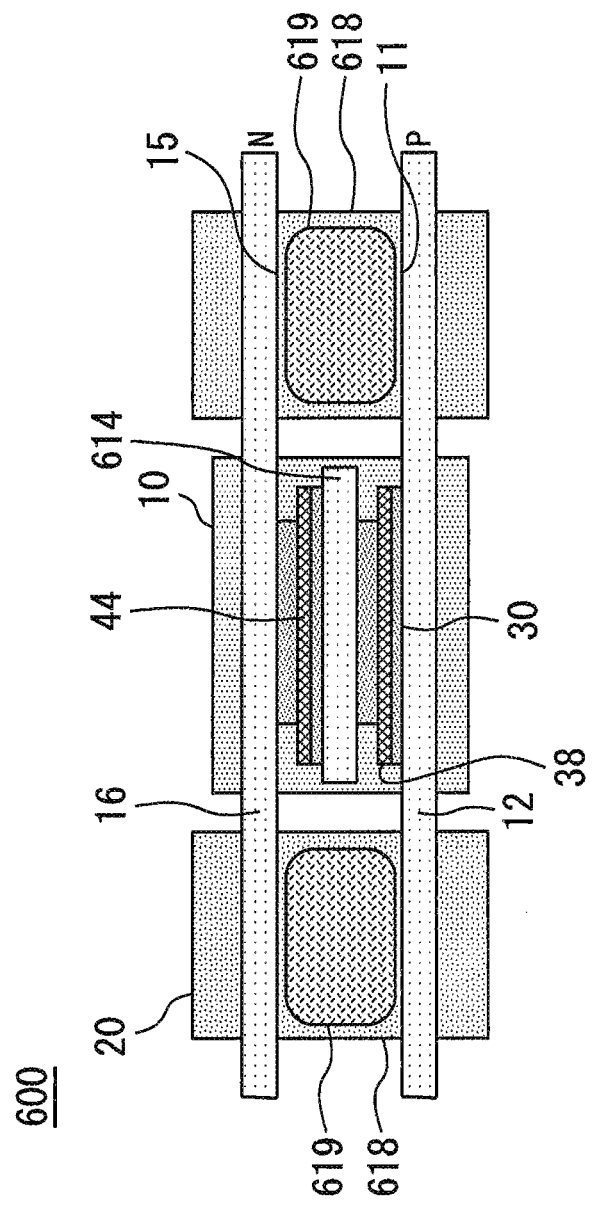
FIG. 9 is a cross-sectional view obtained by cutting the semiconductor device according to the fifth modification of the first embodiment along a I-II line of FIG. 8.
Figure 10:
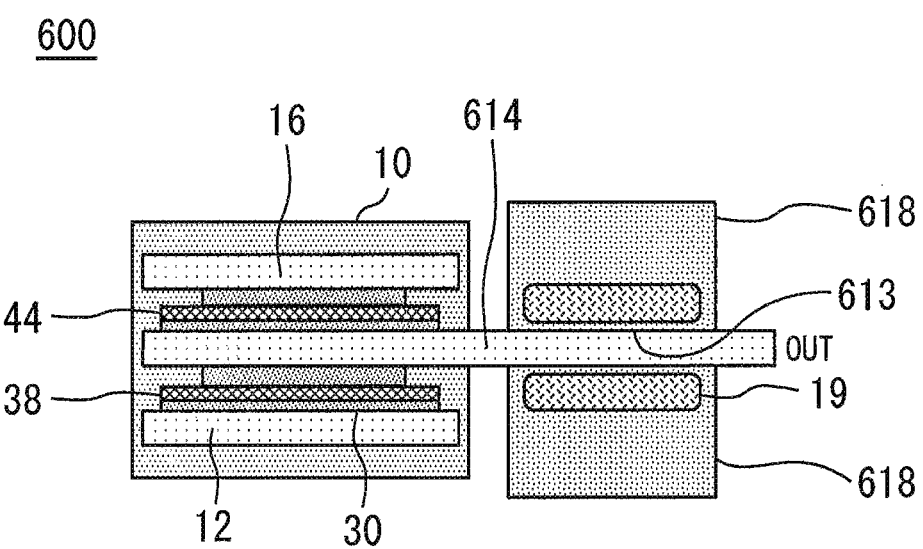
FIG. 10 is a cross-sectional view obtained by cutting the semiconductor device according to the fifth modification of the first embodiment along a III-IV line of FIG. 8.

FIG. 9 is a cross-sectional view obtained by cutting the semiconductor device 600 according to the fifth modification of the first embodiment along a I-II line of FIG. 8. FIG. 10 is a cross-sectional view obtained by cutting the semiconductor device 600 according to the fifth modification of the first embodiment along a III-IV line of FIG. 8. The first cooling portion 11 and the third cooling portion 15 are provided so as to overlap each other when viewed from the direction perpendicular to the first mounting surface 30. The second metal plate 614 and the second cooling portion 613 extend vertically to the first cooling portion 11 and the third cooling portion 15 when viewed from the direction perpendicular to the first mounting surface 30.

The plural cooling members 618 are provided at both sides of the second cooling portion 613 in the direction perpendicular to the first mounting surface 30 respectively. The plural cooling members 618 have plural cooling flow channels 619, respectively. The plural cooling flow channels 619 join each other between the first cooling portion 11 and the third cooling portion 15.

In the fifth modification, the mutual inductance between the P electrode and the N electrode can be reduced. Furthermore, the contact area of the plural cooling members 618 and the first metal plate 12, the second metal plate 614 and the third metal plate 16 can be increased more greatly than that in the fourth modification. Accordingly, the cooling efficiency can be more greatly enhanced as compared with the fourth modification.

Figure 11:
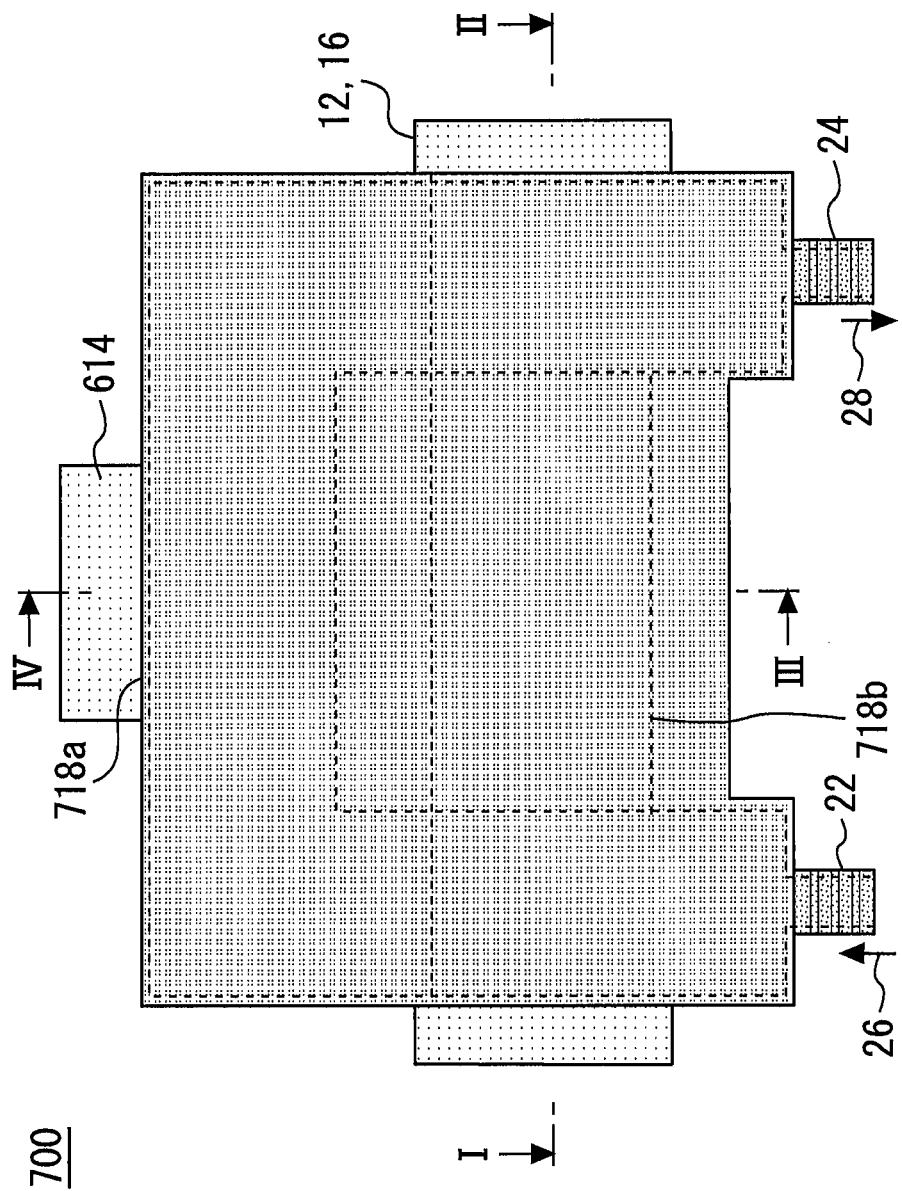
FIG. 11 is a plan view of a semiconductor device according to a sixth modification of the first embodiment.
Figure 12:
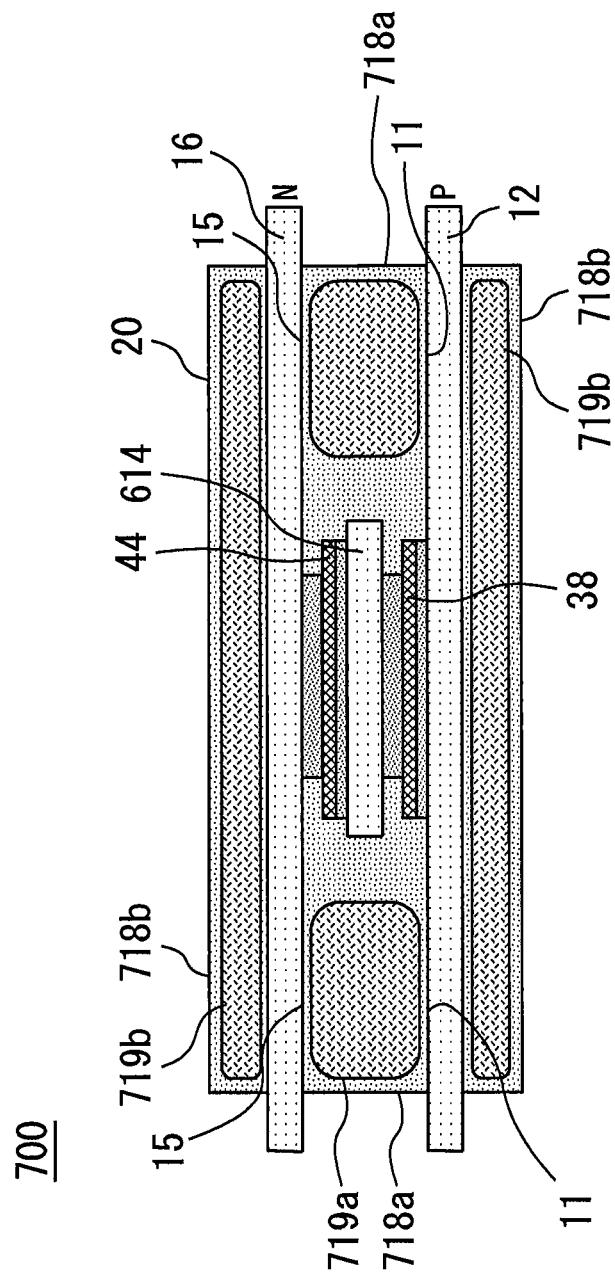
FIG. 12 is a cross-sectional view obtained by cutting the semiconductor device according to the sixth modification of the first embodiment along a I-II line of FIG. 11.
Figure 13:
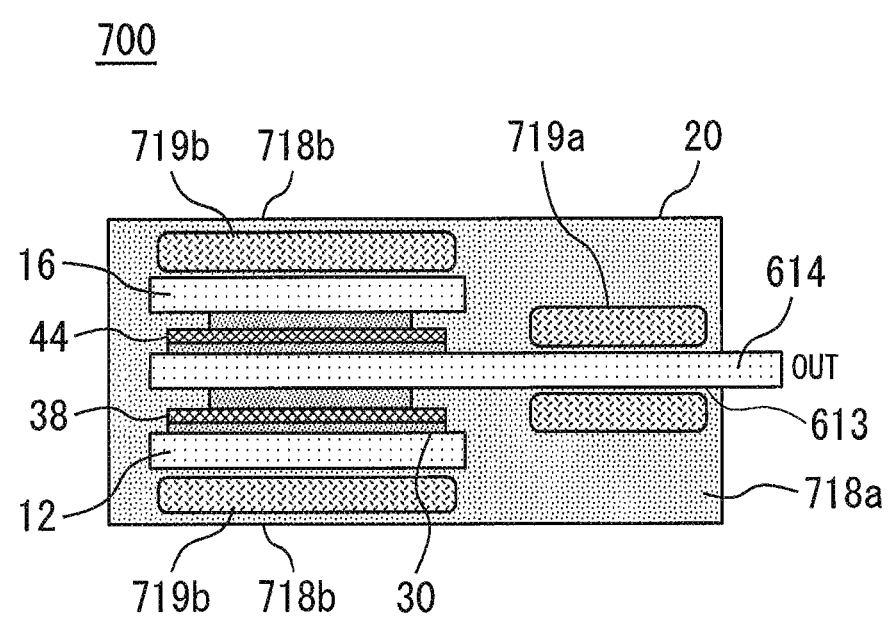
FIG. 13 is a cross-sectional view obtained by cutting the semiconductor device of the sixth modification of the first embodiment along a III-IV line of FIG. 11.

FIG. 11 is a plan view of a semiconductor device 700 according to a sixth modification of the first embodiment. FIG. 12 is a cross-sectional view obtained by cutting the semiconductor device 700 according to the sixth modification of the first embodiment along a I-II line of FIG. 11. FIG. 13 is a cross-sectional view obtained by cutting the semiconductor device 700 of the sixth modification of the first embodiment along a III-IV line of FIG. 11. In the sixth modification, the structures of plural cooling members 718a, 718b are different from those of the fifth modification. Furthermore, the semiconductor device 700 does not have the sealing member 10. The other structures thereof are the same as the fifth modification.

The plural cooling members 718a are provided at both sides of the second cooling portion 613 in the direction perpendicular to the first mounting surface 30. The plural cooling members 718a have plural cooling flow channels 719a, respectively. The plural cooling flow channels 719a join each other between the first cooling portion 11 and the third cooling portion 15.

The plural cooling members 718b are provided just below the first semiconductor chip 38 and just above the second semiconductor chip 44, respectively. The plural cooling members 718b have plural cooling flow channels 719b, respectively. The cooling flow channel 719b just below the first semiconductor chip 38 extends from a position just below one first cooling portion 11 out of the plural first cooling portions 11 provided at both sides of the first semiconductor chip 38 to a position just below the other first cooling portion 11 out of the plural first cooling portions 11. The cooling flow channel 719b just above the second semiconductor chip 44 extends from a position just above one third cooling portion 15 out of the plural third cooling portions 15 provided at both sides of the second semiconductor chip 44 to the other third cooling portion 15 out of the plural third cooling portions 15.

Each of the plural cooling flow channels 719a, 719b is surrounded by the insulator 20. Each of the first semiconductor chip 38 and the second semiconductor chip 44 is also surrounded by the insulator 20.

In the sixth modification, the cooling member 718b is in contact with the first metal plate 12 just below the first semiconductor chip 38. The cooling member 718b is in contact with the third metal plate 16 just above the second semiconductor chip 44. Therefore, the semiconductor device 700 can be cooled from the position just below the first semiconductor chip 38 and the position just above the second semiconductor chip 44. Accordingly, the cooling performance can be more greatly enhanced as compared with the fifth modification.

These modifications can be applied, as appropriate, to a semiconductor device according to the following embodiments. Note that the semiconductor device according to the following embodiments are similar to those of the first embodiment in many respects, and thus differences between the semiconductor device according to the following embodiments and those of the first embodiment will be mainly described below.

Second Embodiment

Figure 14:
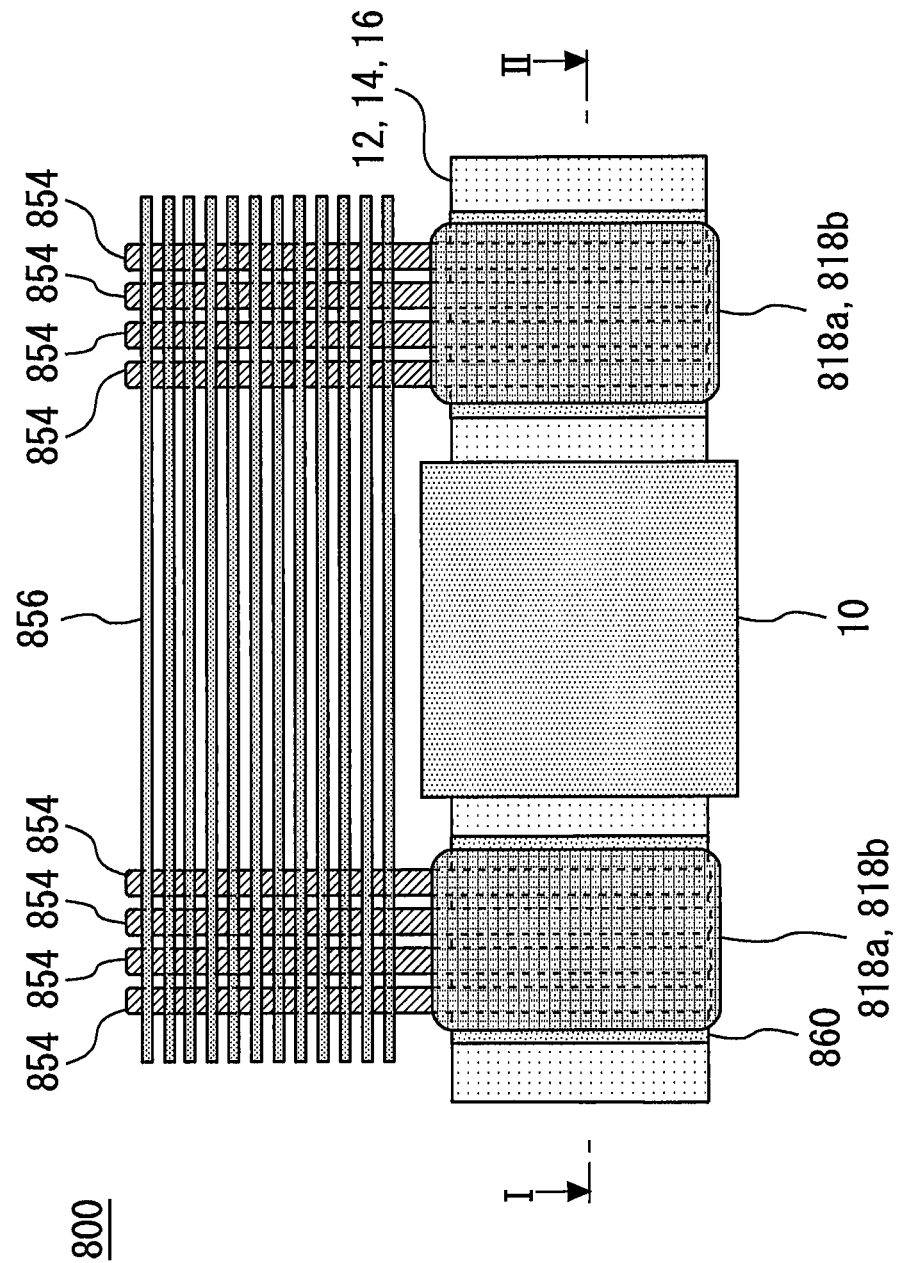
FIG. 14 is a plan view showing a semiconductor device according to a second embodiment.

FIG. 14 is a plan view showing a semiconductor device 800 according to a second embodiment. In this embodiment, the structures of plural cooling members 818a, 818b are different from that of the first embodiment. Each of the plural cooling members 818a, 818b has plural heat pipes 854. One end of each heat pipe 854 is provided above or below any metal plate of the first metal plate 12, the second metal plate 14 and the third metal plate 16. The other end of each heat pipe 854 is connected to a heat sink 856.

Each heat pipe 854 has operating liquid therein. The operating liquid is vaporized by heat from the first metal plate 12, the second metal plate 14 or the third metal plate 16. The vapor of the operating liquid moves toward the heat sink 856 in the heat pipe 854. The vapor of the operating liquid is cooled to be returned to liquid on the side of the heat sink 856. Thereafter, the operating liquid moves toward the first metal plate 12, the second metal plate 14 and the third metal plate 16 in the heat pipes 854. The first metal plate 12, the second metal plate 14 and the third metal plate 16 are cooled in the above process.

Figure 15:
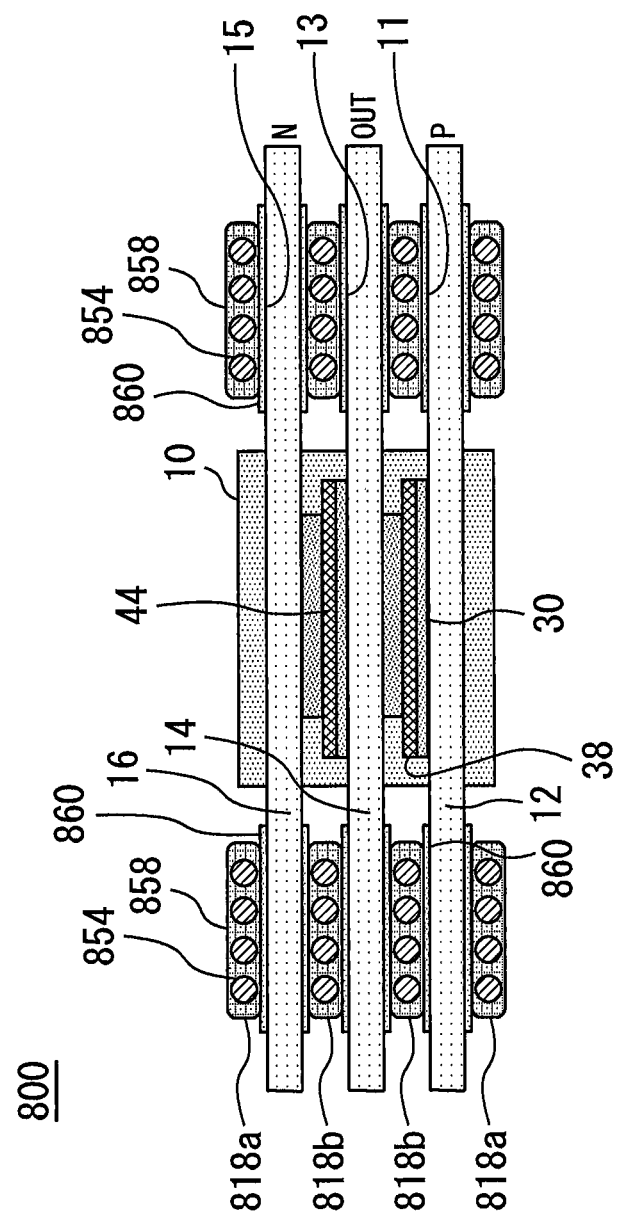
FIG. 15 is a cross-sectional view of the semiconductor device according to the second embodiment.

FIG. 15 is a cross-sectional view of the semiconductor device 800 according to the second embodiment. The plural cooling members 818b are provided between the first cooling portion 11 and the second cooling portion 13 and between the second cooling portion 13 and the third cooling portion 15 respectively. Furthermore, the plural cooling members 818a are provided to a surface of the first cooling portion 11 on the opposite side to the second cooling portion 13, and a surface of the third cooling portion 15 on the opposite side to the second cooling portion 13 respectively. The first metal plate 12, the second metal plate 14 and the third metal plate 16 are in contact with the plural cooling members 818a, 818b at both sides of the sealing member 10, respectively.

Each cooling member 818a has four heat pipes 854, a metal body 858 and an insulating layer 860. The metal body 858 surrounds the four heat pipes 854. The four heat pipes 854 are embedded in the metal body 858. The insulating layer 860 is provided between the metal body 858 and the first metal plate 12 or the third metal plate 16. Each cooling member 818b has four heat pipes 854, a metal body 858 and two insulating layers 860. The two insulating layers 860 are provided at the upper and lower sides of the metal body 858, respectively. The number of the heat pipes 854 provided to each of the plural cooling members 818a, 818b may be any number other than four.

Each of the first metal plate 12, the second metal plate 14 and the third metal plate 16 is connected to the plural heat pipes 854 via the insulating layer 860 and the metal body 858. The heat of each of the first metal plate 12, the second metal plate 14 and the third metal plate 16 is radiated through the insulating layer 860 and the metal body 858 by the plural heat pipes 854.

In this embodiment, the semiconductor device 800 can be also efficiently cooled by the plural cooling members 818a, 818b. Furthermore, in this embodiment, it is unnecessary to supply and circulate cooling liquid from the outside. Therefore, the structure of the semiconductor device 800 can be simplified. In addition, the maintenance of the semiconductor device 800 can be facilitated.

Figure 16:
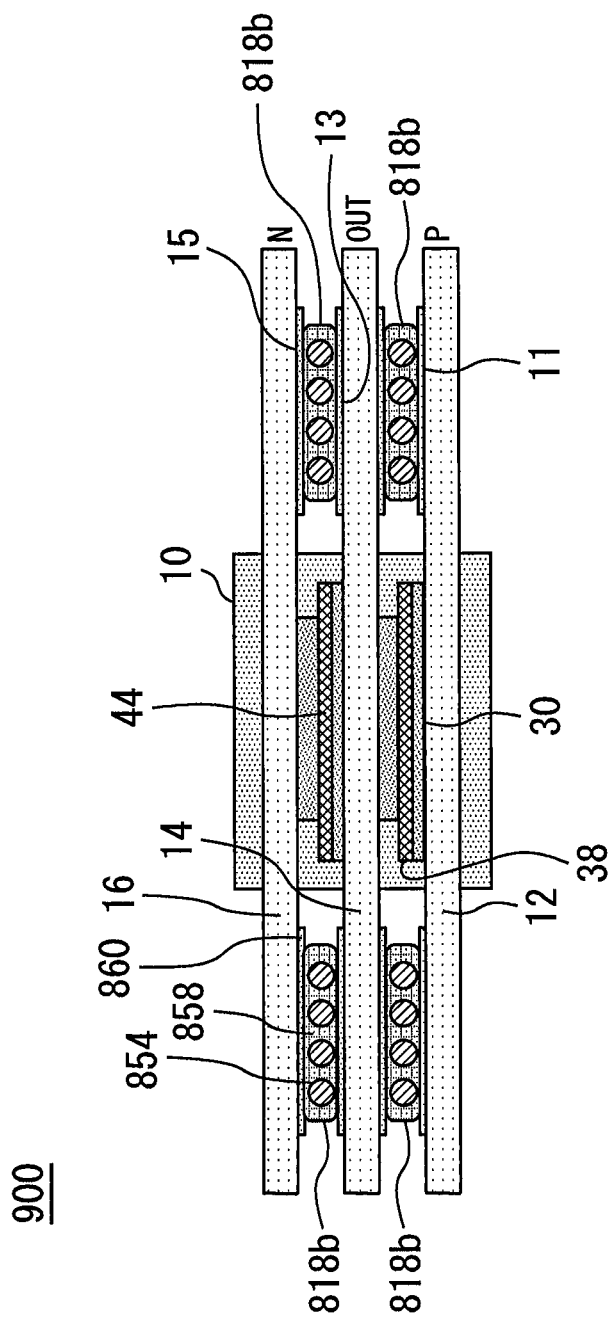
FIG. 16 is a cross-sectional view of a semiconductor device according to a first modification of the second embodiment.

FIG. 16 is a cross-sectional view of a semiconductor device 900 according to a first modification of the second embodiment. The semiconductor device 900 does not have plural cooling members 818a. In the semiconductor device 900, the plural cooling members 818b are arranged only between the first cooling portion 11 and the second cooling portion 13 and between the second cooling portion 13 and the third cooling portion 15 respectively. In the first modification, the semiconductor device 900 can be reduced in thickness as compared with the second embodiment. Furthermore, as compared with the second embodiment, the numbers of the cooling members 818a, 818b are reduced, so that the manufacturing cost of the semiconductor device 900 can be reduced.

Figure 17:
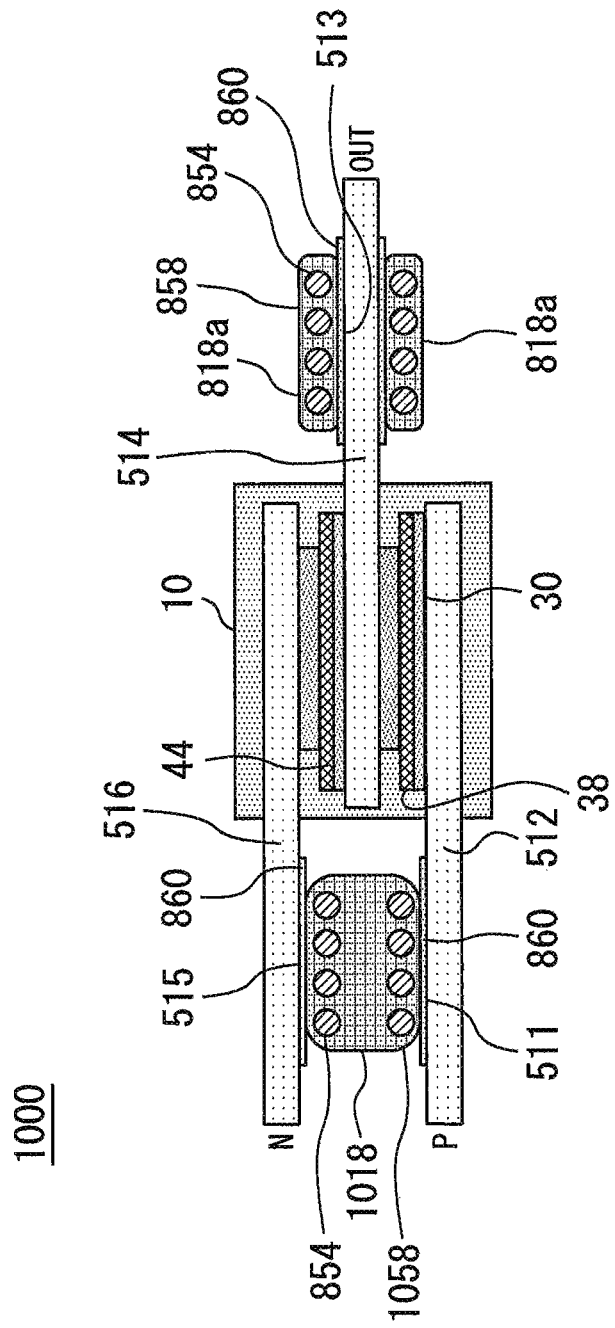
FIG. 17 is a cross-sectional view showing a semiconductor device according to a second modification of the second embodiment.

FIG. 17 is a cross-sectional view showing a semiconductor device 1000 according to a second modification of the second embodiment. The semiconductor device 1000 is different from the semiconductor device 500 in the structures of the plural cooling members 818a, 1018. The plural cooling members 818a are provided at both sides of the second cooling portion 513 in the direction perpendicular to the first mounting surface 30 respectively. The cooling member 1018 is provided between the first cooling portion 511 and the third cooling portion 515. The cooling member 1018 has eight heat pipes 854, a metal body 1058 and two insulating layers 860. The two insulating layers 860 are provided at the upper and lower sides of the metal body 1058, respectively. The number of the heat pipes 854 provided to the cooling member 1018 may be any number other than eight.

In the semiconductor device 1000, the P electrode and the N electrode are provided to extend in parallel to each other. Accordingly, the mutual inductance between the P electrode and the N electrode can be reduced. Furthermore, since the second metal plate 514 serving as the output electrode protrudes to the opposite side to the first metal plate 512 and the third metal plate 516, a load and the semiconductor device 1000 can be easily connected to each other.

Third Embodiment

Figure 18:
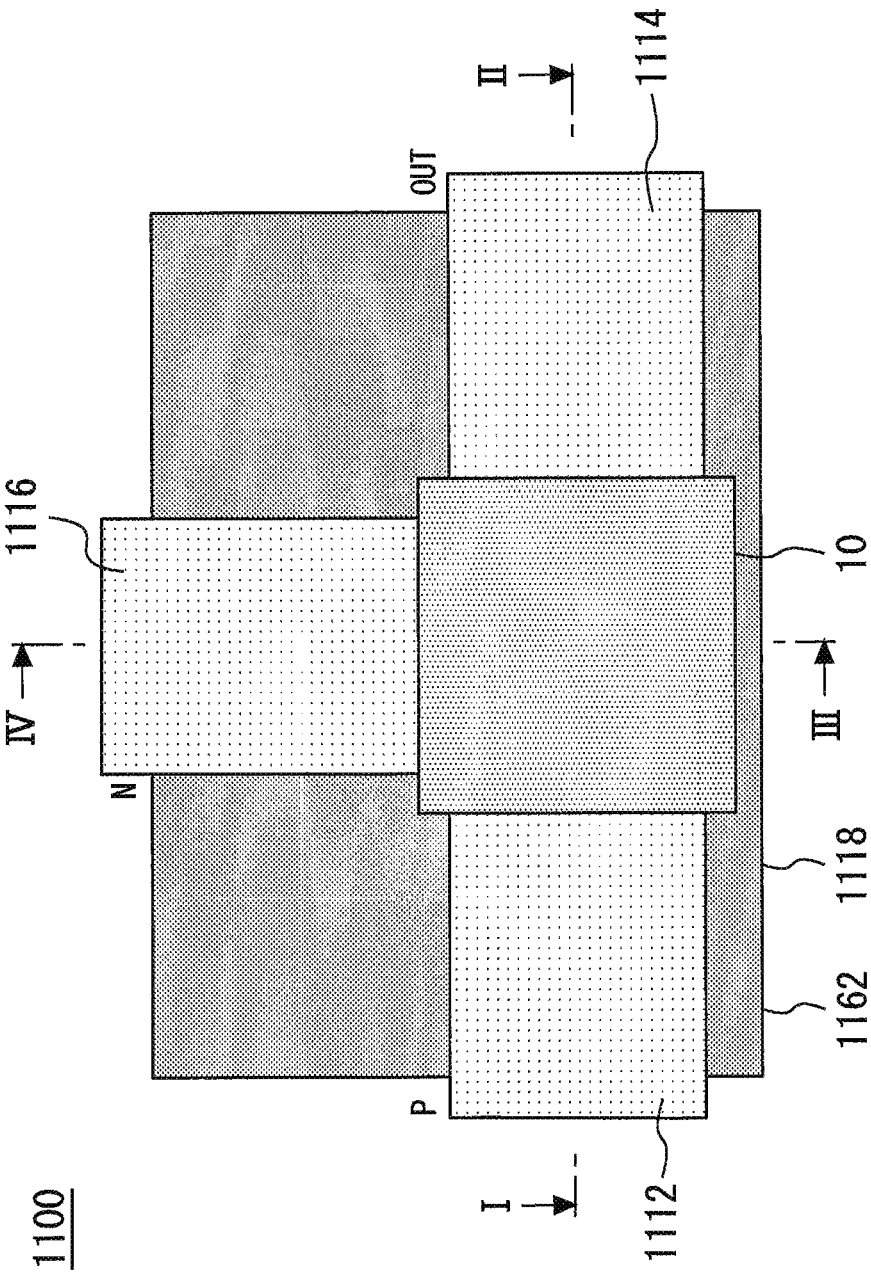
FIG. 18 is a plan view of a semiconductor device according to a third embodiment.

FIG. 18 is a plan view of a semiconductor device 1100 according to a third embodiment. The semiconductor device 1100 has a cooling member 1118. The cooling member 1118 has a heat sink 1162. A first metal plate 1112, a second metal plate 1114 and a third metal plate 1116 protrude from the sealing member 10. The second metal plate 1114 extends from the sealing member 10 in a direction different from the extension direction of the first metal plate 1112. The third metal plate 1116 extends from the sealing member 10 in a direction different from the extension directions of the first metal plate 1112 and the second metal plate 1114.

Figure 19:
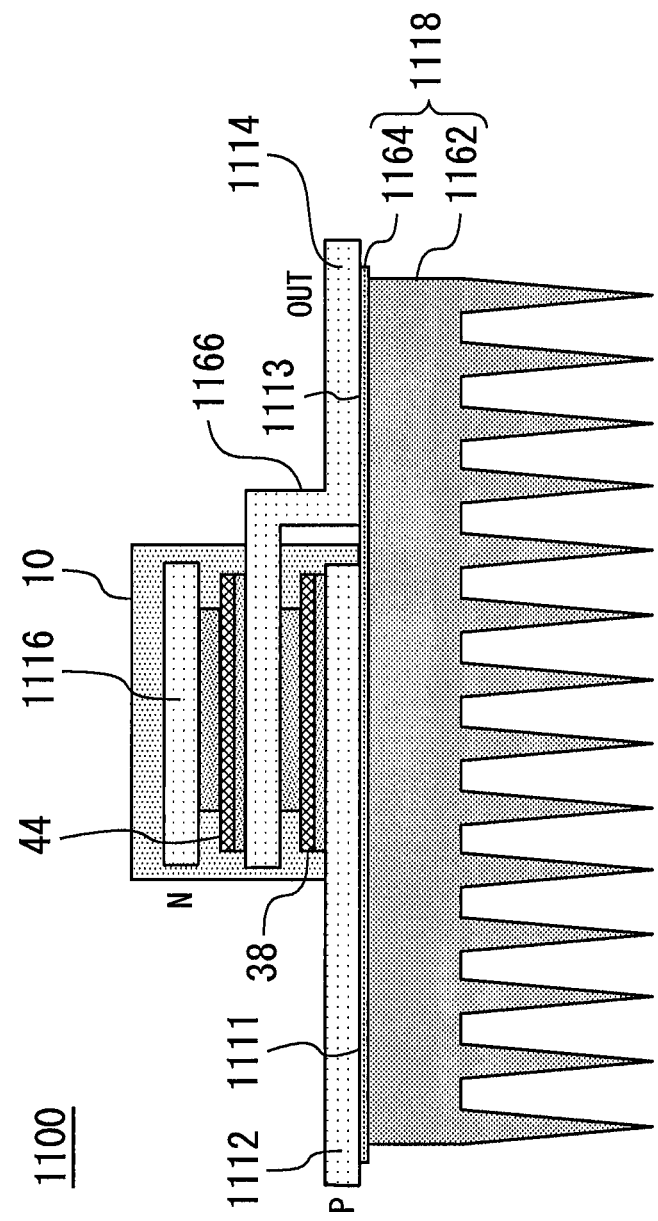
FIG. 19 is a cross-sectional view obtained by cutting the semiconductor device according to the third embodiment along a I-II line of FIG. 18.
Figure 20:
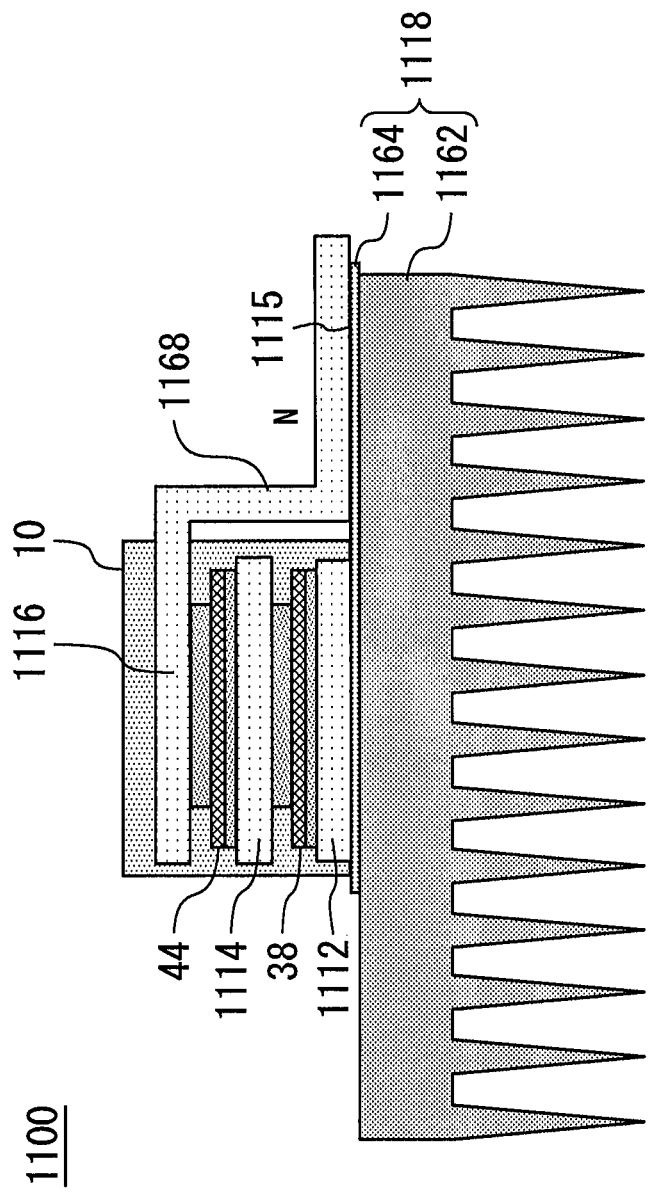
FIG. 20 is a cross-sectional view obtained by cutting the semiconductor device according to the third embodiment along a III-IV line of FIG. 18.

FIG. 19 is a cross-sectional view obtained by cutting the semiconductor device 1100 according to the third embodiment along a I-II line of FIG. 18. FIG. 20 is a cross-sectional view obtained by cutting the semiconductor device 1100 according to the third embodiment along a III-IV line of FIG. 18. The cooling member 1118 has a heat sink 1162 and an insulating layer 1164. The insulating layer 1164 is provided on the heat sink 1162.

The first metal plate 1112 is provided on an upper surface of the cooling member 1118. The first metal plate 1112 is provided on the insulating layer 1164. The first metal plate 1112 has a first cooling portion 1111 extending from a portion to which the first semiconductor chip 38 is joined. The first cooling portion 1111 extends to the upper surface of the cooling member 1118.

The second metal plate 1114 has a second cooling portion 1113 extending from a portion to which the first semiconductor chip 38 and the second semiconductor chip 44 are joined. The second cooling portion 1113 has a first crooked portion 1166 crooked to the cooling member 1118. An end portion of the second cooling portion 1113 on the opposite side to the second semiconductor chip 44 with respect to the first crooked portion 1166 extends on the upper surface of the cooling member 1118.

The third metal plate 1116 has a third cooling portion 1115 extending from a portion to which the second semiconductor chip 44 is joined. The third cooling portion 1115 has a second crooked portion 1168 crooked to the cooling member

1118. An end portion of the third cooling portion 1115 on the opposite side to the second semiconductor chip 44 with respect to the second crooked portion 1168 extends on the upper surface of the cooling member 1118.

The second cooling portion 1113 extends to the opposite side to the first cooling portion 1111 when viewed from the direction perpendicular to the first mounting surface 30. The third cooling portion 1115 extends vertically to the first cooling portion 1111 when viewed from the direction perpendicular to the first mounting surface 30.

In this embodiment, the first metal plate 1112, the second metal plate 1114 and the third metal plate 1116 are in contact with the upper surface of the cooling member 1118. Accordingly, heat of the first metal plate 1112, the second metal plate 1114 and the third metal plate 1116 is radiated from the heat sink 1162 via the insulating layer 1164. Accordingly, the semiconductor device 1100 can be efficiently cooled.

Furthermore, in this embodiment, the contact area of the first metal plate 1112, the second metal plate 1114 and the third metal plate 1116 and the cooling member 1118 can be easily changed. Therefore, the semiconductor device 1100 can be further efficiently cooled by setting the contact area to a large value. Furthermore, in the embodiment, the cooling member 1118 is configured by the heat sink which is generally widely used to cool a semiconductor module. Accordingly, the cooling member 1118 can be easily prepared.

The directions along which the first cooling portion 1111, the second cooling portion 1113 and the third cooling portion 1115 are led out from the sealing member 10 are not limited to those shown in FIG. 18. The first cooling portion 1111, the second cooling portion 1113 and the third cooling portion 1115 may be provided so as not to overlap with one another when viewed from the direction perpendicular to the first mounting surface 30. The second cooling portion 1113 may be provided so as to extend in a direction different from the extension direction of the first cooling portion 1111 when viewed from the direction perpendicular to the first mounting surface 30. Furthermore, the third cooling portion 1115 may be provided so as to extend in a direction different from the extension directions of the first cooling portion 1111 and the second cooling portion 1113 when viewed from the direction perpendicular to the first mounting surface 30.

Figure 21:
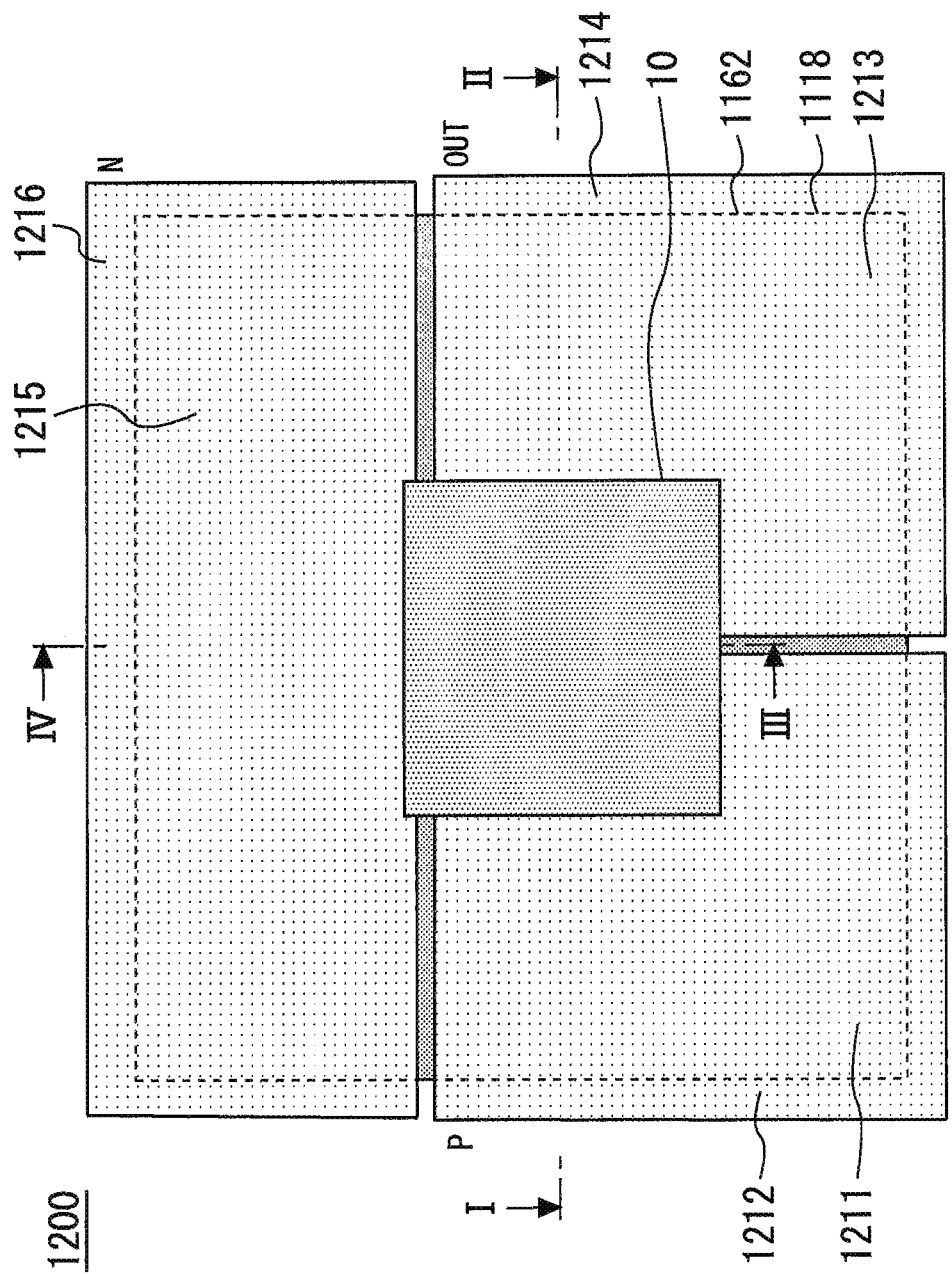
FIG. 21 is a plan view showing a semiconductor device according to a first modification of the third embodiment.

FIG. 21 is a plan view showing a semiconductor device 1200 according to a first modification of the third embodiment. In the semiconductor device 1200, the structures of a first metal plate 1212, a second metal plate 1214 and a third metal plate 1216 are different from those of the semiconductor device 1100. The areas of the portions of the first metal plate 1212, the second metal plate 1214 and the third metal plate 1216 which protrude from the sealing member 10 are larger than those of the semiconductor device 1100.

The whole area of the upper surface of the cooling member 1118 is covered by the first metal plate 1212, the second metal plate 1214, the third metal plate 1216 and the sealing member 10. The first metal plate 1212, the second metal plate 1214 and the third metal plate 1216 are provided so as to protrude from the end portions of the upper surface of the cooling member 1118. The third cooling portion 1215 is larger in width than the upper surface of the cooling member 1118. However, this modification is not limited to this configuration, and the first cooling portion 1211 or the second cooling portion 1213 may be larger in width than the upper surface of the cooling member 1118.

Furthermore, the first metal plate 1212, the second metal plate 1214 and the third metal plate 1216 are larger in width than the sealing member 10. As described above, a large contact area is secured for the contact area of each of the first metal plate 1212, the second metal plate 1214 and the third metal plate 1216 and the cooling member 1118 in the semiconductor device 1200.

The second cooling portion 1213 extends to the opposite side to the first cooling portion 1211 when viewed from the direction perpendicular to the first mounting surface 30. The third cooling portion 1215 extends to the opposite side to the first cooling portion 1211 and the second cooling portion 1213 when viewed from the direction perpendicular to the first mounting surface 30.

Figure 22:
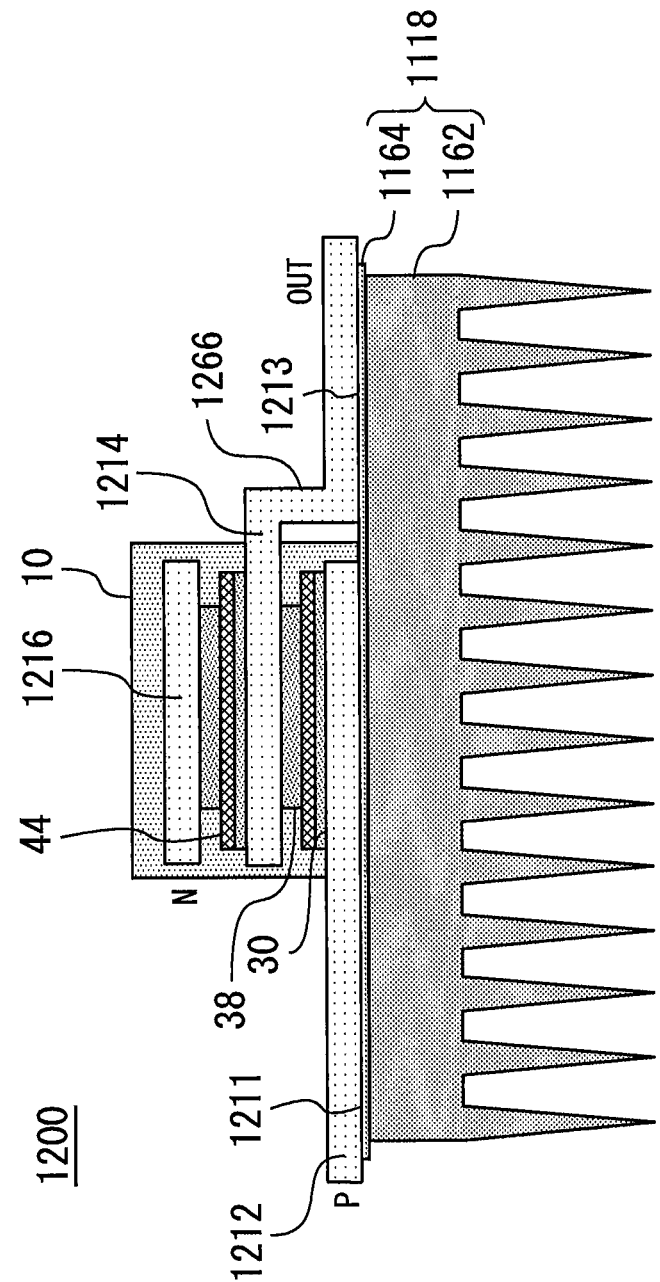
FIG. 22 is a cross-sectional view obtained by cutting the semiconductor device according to the first modification of the third embodiment 3 along a I-II line of FIG. 21.
Figure 23:
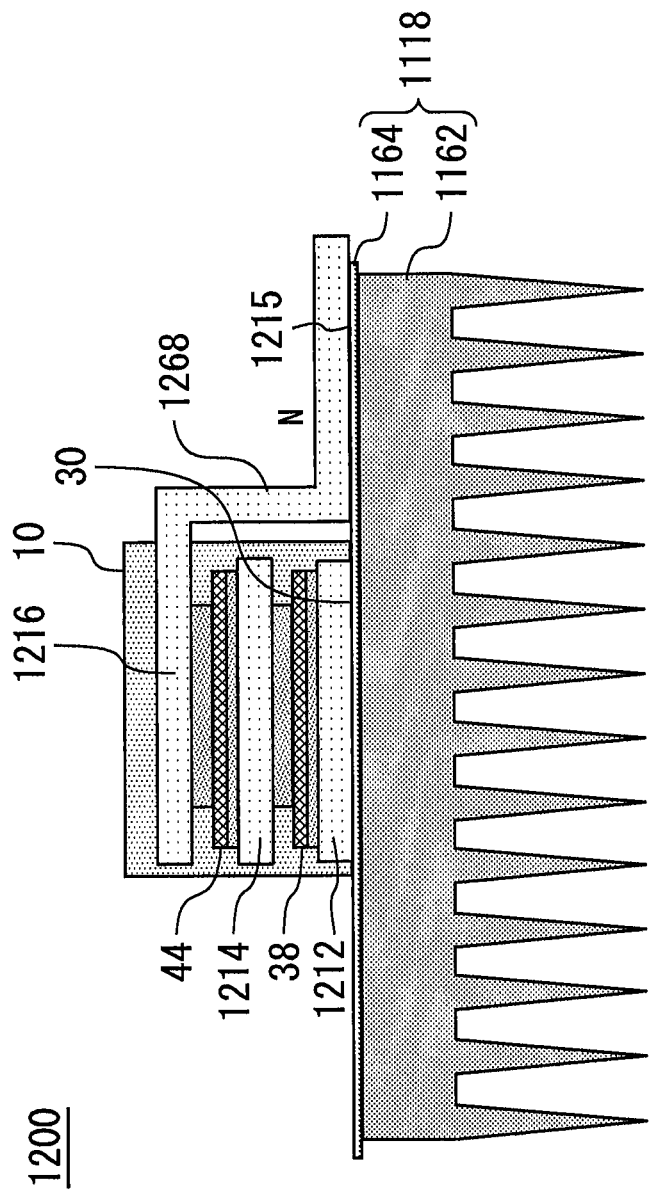
FIG. 23 is a cross-sectional view obtained by cutting the semiconductor device according to the first modification of the third embodiment along a III-IV line of FIG. 21.

FIG. 22 is a cross-sectional view obtained by cutting the semiconductor device 1200 according to the first modification of the third embodiment along a I-II line of FIG. 21. FIG. 23 is a cross-sectional view obtained by cutting the semiconductor device 1200 according to the first modification of the third embodiment along a III-IV line of FIG. 21. The first metal plate 1212 is provided on the upper surface of the cooling member 1118. The first cooling portion 1211 extends on the upper surface of the cooling member 1118.

The second metal plate 1214 has a second cooling portion 1213. The second cooling portion 1213 has a first crooked portion 1266 crooked to the cooling member 1118. An end portion of the second cooling portion 1213 on the opposite side to the second semiconductor chip 44 with respect to the first crooked portion 1266 extends on the upper surface of the cooling member 1218. The third metal plate 1216 has a third cooling portion 1215. The third cooling portion 1215 has a second crooked portion 1268 crooked to the cooling member 1118. An end portion of the third cooling portion 1215 on the opposite side to the second semiconductor chip 44 with respect to the second crooked portion 1268 extends on the upper surface of the cooling member 1218.

In the semiconductor device 1200, the contact area of the first cooling portion 1211, the second cooling portion 1213 and the third cooling portion 1215 and the cooling member 1118 is larger as compared with that in the semiconductor device 1100. Accordingly, the semiconductor device 1200 can be efficiently cooled.

Figure 24:
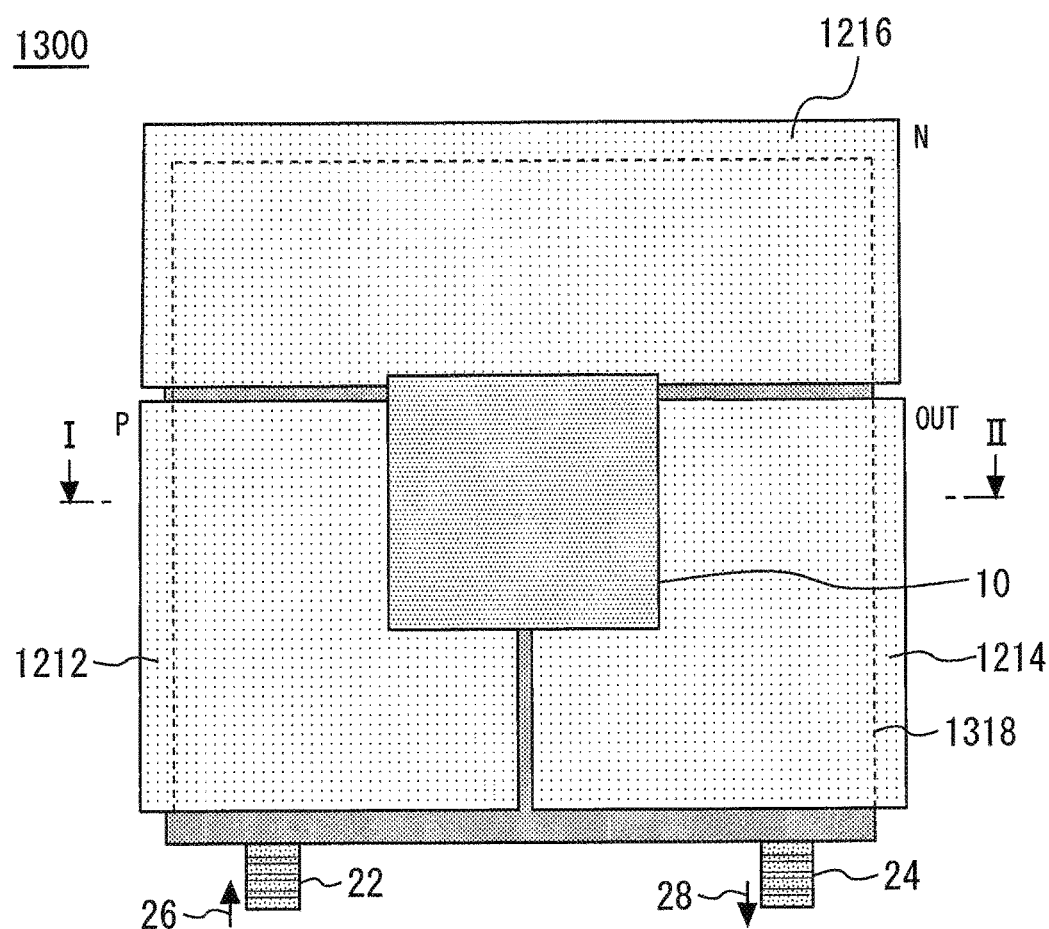
FIG. 24 is a plan view showing a semiconductor device according to a second modification of the third embodiment.
Figure 25:
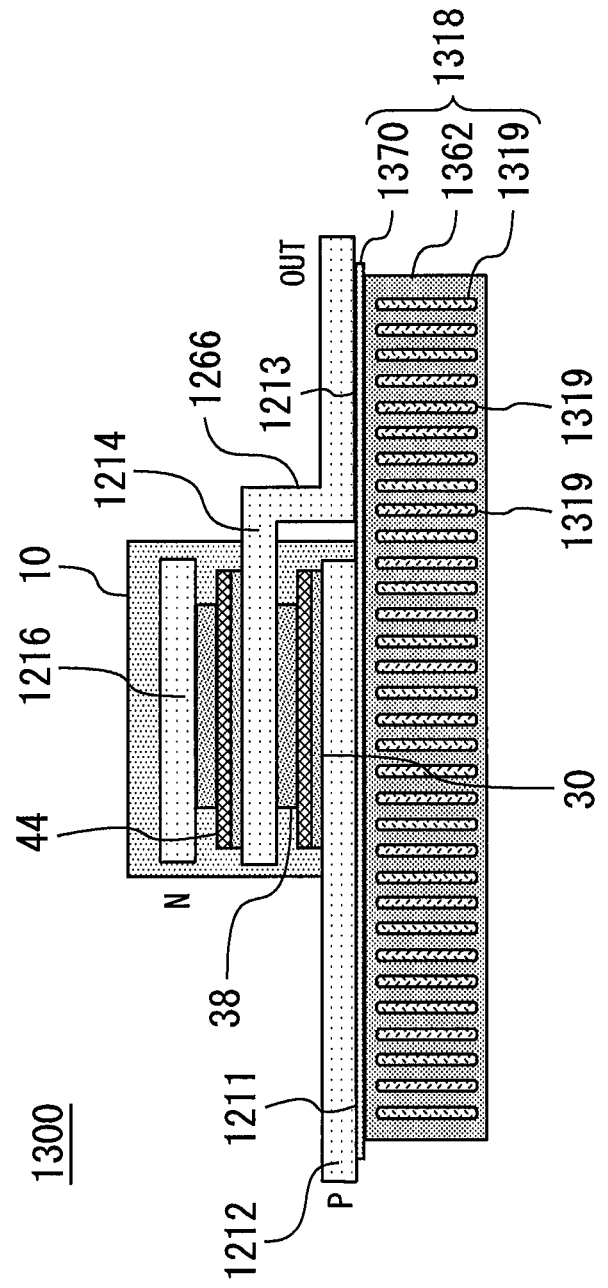
FIG. 25 is a cross-sectional view obtained by cutting the semiconductor device of the second modification of the third embodiment along a I-II line of FIG. 24.

FIG. 24 is a plan view showing a semiconductor device 1300 according to a second modification of the third embodiment. FIG. 25 is a cross-sectional view obtained by cutting the semiconductor device 1300 of the second modification of the third embodiment along a I-II line of FIG. 24. In the semiconductor device 1300, the structure of the cooling member 1318 is different from that of the semiconductor device 1200.

The cooling member 1318 has a heat sink 1362. The heat sink 1362 is provided with plural cooling flow channels 1319. Cooling liquid is poured from an inflow port 22 into the plural cooling flow channels 1319. The cooling liquid flows out from an outflow port 24. The heat sink 1362 is a liquid cooling type heat sink.

An insulating layer 1370 is provided on the heat sink 1362. A first metal plate 1212 is provided on the insulating layer 1370. A first cooling portion 1211, a second cooling portion 1213 and a third cooling portion 1215 are in contact with the upper surface of the cooling member 1318.

Heat of the first metal plate 1212, the second metal plate 1214 and the third metal plate 1216 is conducted to the heat sink 1362 via the insulating layer 1370. The heat of the first metal plate 1212, the second metal plate 1214 and the third metal plate 1216 is subjected to liquid-cooling in the heat sink 1362. Accordingly, the semiconductor device 1300 can be more efficiently cooled than the semiconductor device 1200.

Figure 26:
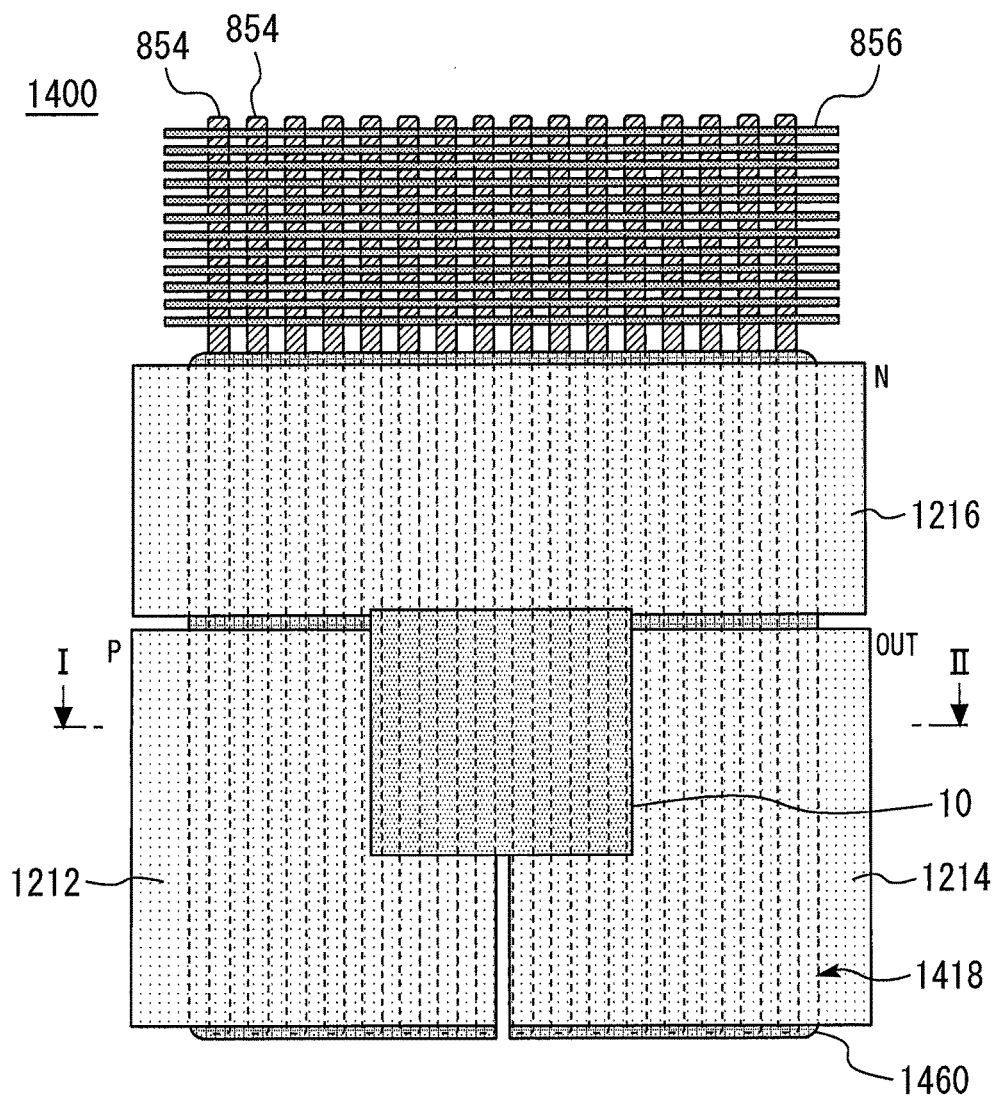
FIG. 26 is a plan view showing a semiconductor device according to a third modification of the third embodiment.
Figure 27:
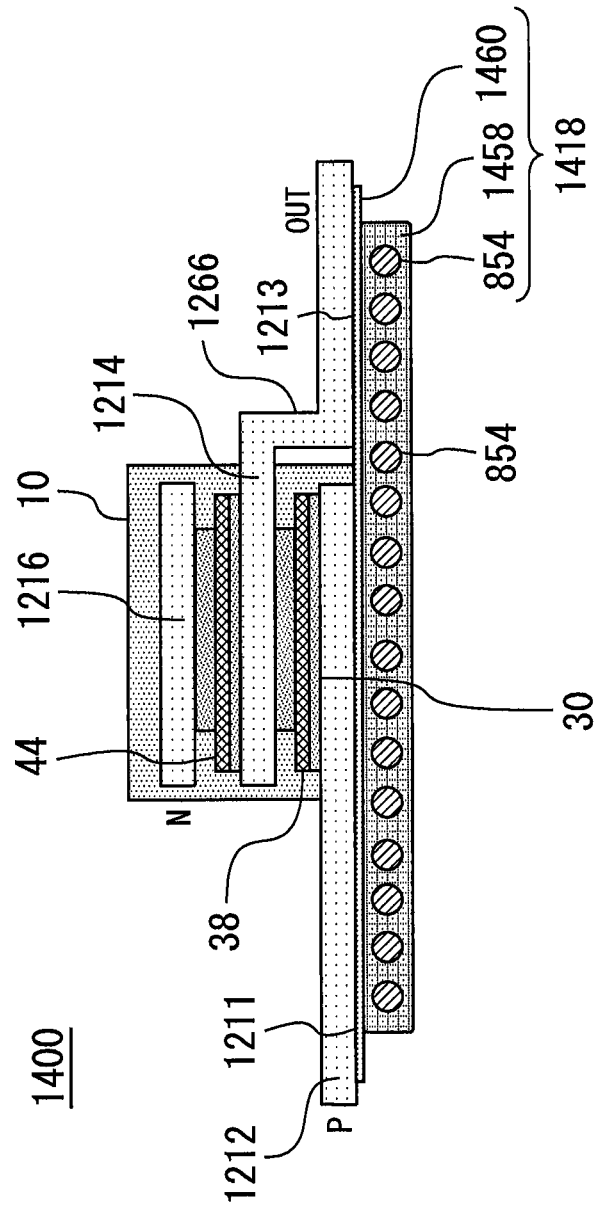
FIG. 27 is a cross-sectional view obtained by cutting the semiconductor device according to the third modification of the third embodiment along a I-II line of FIG. 26.

FIG. 26 is a plan view showing a semiconductor device 1400 according to a third modification of the third embodiment. FIG. 27 is a cross-sectional view obtained by cutting the semiconductor device 1400 according to the third modification of the third embodiment along a I-II line of FIG. 26. In the semiconductor device 1400, the structure of the cooling member 1418 is different from that of the semiconductor device 1200.

The cooling member 1418 has plural heat pipes 854. One end of each heat pipe 854 is provided below the first metal plate 1212, the second metal plate 1214 or the third metal plate 1216. The other end of each heat pipe 854 is connected to the heat sink 856.

The cooling member 1418 has plural heat pipes 854, a metal body 1458 and an insulating layer 1460. The plural heat pipes 854 are embedded in the metal body 1458. The insulating layer 1460 is provided between the metal body 1458 and the first cooling portion 1211, the second cooling portion 1213 and the third cooling portion 1215. The number of the heat pipes provided to the cooling member 1418 may be equal to one or more.

In the semiconductor device 1400, it is unnecessary to supply and circulate cooling liquid from the outside. Therefore, the structure of the semiconductor device 1400 can be simplified. Furthermore, the maintenance of the semiconductor device 1400 can be facilitated.

Note that the technical features described in the above embodiments may be combined as appropriate.

In the semiconductor device according to the present invention, all of the first to third metal plates are in contact with the cooling members. Therefore, the semiconductor device can be efficiently cooled.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2017-154595, filed on Aug. 9, 2017 including specification, claims, drawings and summary, on which the Convention priority of the present application is based, are incorporated herein by reference in its entirety.

The invention claimed is:

1. A semiconductor device comprising:
a first metal plate having a first mounting surface;
a second metal plate having a second mounting surface facing the first mounting surface, and a third mounting surface which is a surface on an opposite side to the second mounting surface, the second metal plate being provided above the first metal plate;
a third metal plate that has a fourth mounting surface facing the third mounting surface, and is provided above the second metal plate;
a first semiconductor chip that is provided between the first metal plate and the second metal plate, the first semiconductor chip including a back-side electrode joined to the first mounting surface and an upper-side electrode joined to the second mounting surface;
a second semiconductor chip that is provided between the second metal plate and the third metal plate, and has another back-side electrode joined to the third mounting surface and another upper-side electrode joined to the fourth mounting surface; and
a cooling member,
wherein the first metal plate has a first cooling portion that extends from a portion to which the first semiconductor chip is joined, and is in contact with the cooling member,
the second metal plate has a second cooling portion that extends from a portion to which the first semiconductor chip and the second semiconductor chip are joined, and is in contact with the cooling member, and
the third metal plate has a third cooling portion that extends from a portion to which the second semiconductor chip is joined, and is in contact with the cooling member.

2. The semiconductor device according to claim 1, further comprising
a sealing member for sealing the first semiconductor chip and the second semiconductor chip,
wherein the second cooling portion and the third cooling portion protrude from a side surface of the sealing member.

3. The semiconductor device according to claim 1,
wherein a plurality of the cooling members are provided,
the first cooling portion, the second cooling portion and the third cooling portion are provided so as to overlap one another when viewed from a direction perpendicular to the first mounting surface, and
the plurality of the cooling members are provided between the first cooling portion and the second cooling portion and between the second cooling portion and the third cooling portion respectively.

4. The semiconductor device according to claim 3, wherein the plurality of the cooling members are provided to a surface of the first cooling portion on an opposite side to the second cooling portion and to a surface of the third cooling portion on an opposite side to the second cooling portion respectively.

5. The semiconductor device according to claim 3,
wherein the first metal plate has a plurality of first cooling portions extending from both sides of the portion to which the first semiconductor chip is joined,
the second metal plate has a plurality of second cooling portions extending from both sides of the portion to which the first semiconductor chip and the second semiconductor chip are joined, and
the third metal plate has a plurality of third cooling portions extending from both sides of the portion to which the second semiconductor chip is joined.

6. The semiconductor device according to claim 1,
wherein a plurality of the cooling members are provided,
the first cooling portion and the third cooling portion are provided so as to overlap each other when viewed from a direction perpendicular to the first mounting surface,
the second cooling portion extends from the portion to which the first semiconductor chip and the second semiconductor chip are joined, in a direction different from a directions in which the first cooling portion and the third cooling portion extend when viewed from a direction perpendicular to the first mounting surface, and
the plurality of the cooling members are provided between the first cooling portion and the third cooling portion and on both sides of the second cooling portion in the direction perpendicular to the first mounting surface respectively.

7. The semiconductor device according to claim 6, wherein the second cooling portion extends from the portion to which the first semiconductor chip and the second semiconductor chip are joined, in a direction toward an opposite side to the first cooling portion and the third cooling portion when viewed from the direction perpendicular to the first mounting surface.

8. The semiconductor device according to claim 1, wherein the cooling member is provided outside an area where the first semiconductor chip and the second semiconductor chip are provided when viewed from a direction perpendicular to the first mounting surface.

9. The semiconductor device according to claim 3, wherein the plurality of the cooling members are provided just below the first semiconductor chip and just above the second semiconductor chip respectively.

10. The semiconductor device according to claim 1,
wherein the first metal plate is provided on an upper surface of the cooling member,
the first cooling portion extends on the upper surface of the cooling member,
the second cooling portion has a first crooked portion crooked to the cooling member, an end portion of the second cooling portion on an opposite side to the second semiconductor chip with respect to the first crooked portion extends on the upper surface of the cooling member,
the third cooling portion has a second crooked portion crooked to the cooling member, and an end portion of the third cooling portion on an opposite side to the second semiconductor chip with respect to the second crooked portion extends on the upper surface of the cooling member,
the second cooling portion extends in a direction different from a directions in which the first cooling portion extends when viewed from a direction perpendicular to the first mounting surface, and
the third cooling portion extends in a direction different from directions in which the first cooling portion and the second cooling portion extend when viewed from the direction perpendicular to the first mounting surface.

11. The semiconductor device according to claim 10, wherein one of the first cooling portion, the second cooling portion and the third cooling portion is larger in width than the upper surface of the cooling member.

12. The semiconductor device according to claim 1, wherein the surfaces of the first cooling portion, the second cooling portion and the third cooling portion which are in contact with the cooling member are each provided with a plurality of irregularities.

13. The semiconductor device according to claim 10, wherein the cooling member includes a heat sink.

14. The semiconductor device according to claim 1, wherein the cooling member includes a cooling flow channel which is a flow passage for cooling liquid.

15. The semiconductor device according to claim 14, wherein a high thermal-conductive insulator is provided between each of the first cooling portion, the second cooling portion and the third cooling portion and the cooling flow channel.

16. The semiconductor device according to claim 1, wherein the cooling member includes a heat pipe.

* * * * *